US009350322B2

(12) United States Patent
Sakurai

(10) Patent No.: US 9,350,322 B2
(45) Date of Patent: May 24, 2016

(54) SIGNAL OUTPUT DEVICE, COMMUNICATION SYSTEM, SIGNAL OUTPUT METHOD, AND COMMUNICATION METHOD

(71) Applicant: FUJITSU LIMITED, Kawasaki-shi, Kanagawa (JP)

(72) Inventor: Hiroshi Sakurai, Kawasaki (JP)

(73) Assignee: FUJITSU LIMITED, Kawasaki (JP)

(*) Notice: Subject to any disclaimer, the term of this patent is extended or adjusted under 35 U.S.C. 154(b) by 26 days.

(21) Appl. No.: 14/542,739

(22) Filed: Nov. 17, 2014

(65) Prior Publication Data
US 2015/0070105 A1    Mar. 12, 2015

Related U.S. Application Data

(63) Continuation of application No. PCT/JP2012/063084, filed on May 22, 2012.

(51) Int. Cl.
H03K 19/003    (2006.01)
H03H 11/28     (2006.01)
H03K 19/00     (2006.01)
H04L 25/02     (2006.01)

(52) U.S. Cl.
CPC .......... *H03H 11/28* (2013.01); *H03K 19/0005* (2013.01); *H04L 25/0278* (2013.01)

(58) Field of Classification Search
CPC ............. H03K 19/005; H04L 25/0278; H04L 25/0298; H03H 7/38
USPC .............................. 326/30, 82–83, 86; 333/32
See application file for complete search history.

(56) References Cited

U.S. PATENT DOCUMENTS 7,248,636 B2 * 7/2007 Martinez .................... 375/257
7,928,774 B2 * 4/2011 Zannoth et al. ............. 327/108
8,849,520 B2 * 9/2014 Hammerschmidt .......... 701/45

FOREIGN PATENT DOCUMENTS

JP        50-114908    9/1975
JP        3-52437      3/1991
JP        2009-171081  7/2009

OTHER PUBLICATIONS

Espacenet Bibliographic data, Publication No. JPS50114908 (A), published Sep. 9, 1975.
Patent Abstracts of Japan, Publication No. 03-052437, published Mar. 6, 1991.

(Continued)

*Primary Examiner* — Jason M Crawford
(74) *Attorney, Agent, or Firm* — Staas & Halsey LLP

(57) ABSTRACT

A signal output device, in a signal level non-transition period, matches an output impedance of an output section to a characteristic impedance of an output transmission path, and also matches the output impedance of the output section to the characteristic impedance of the output transmission path in a signal level transition period in a case in which a second bit of output-target data is a first value, and generates a mismatch between the output impedance of the output section and the characteristic impedance of the output transmission path in the signal level transition period in a case in which the second bit of the output-target data is a second value, so as to cause generation of a change in waveform in an output signal in the signal level transition period such that an absolute value of a signal level of the output signal exceeds a preset threshold value.

16 Claims, 14 Drawing Sheets

(56) References Cited

OTHER PUBLICATIONS

Patent Abstracts of Japan, Publication No. 2009-171081, published Jul. 30, 2009.

International Search Report mailed Jun. 19, 2012, in corresponding International Patent Application No. PCT/JP2012/063084.

* cited by examiner

SIGNAL OUTPUT DEVICE, COMMUNICATION SYSTEM, SIGNAL OUTPUT METHOD, AND COMMUNICATION METHOD

CROSS-REFERENCE TO RELATED APPLICATION

This application is a continuation application of International Application No. PCT/JP/2012/063084, filed May 22, 2012, the disclosure of which is incorporated herein by reference in its entirety.

FIELD

The embodiments discussed herein are related to a signal output device, a communication system, a signal output method, and a communication method.

BACKGROUND

In a computer system, connection is made between each device through a signal transmission pathway, such as a bus, and each of the devices exchanges signals through the signal transmission pathway. For example, a Central Processing Unit (CPU) is connected to peripheral equipment by a bus, and exchanges signals with the peripheral equipment through the bus. Known methods to increase the communication speed between devices include raising the clock rate of a clock signal, and increasing the number of signal lines.
Related Patent Documents
Japanese Laid-Open Patent Publication No. 2009-171081

However, raising the clock rate affects the characteristic impedance of the signal transmission pathway, and affects external noise (for example signal waveform deterioration due to the skin effect and extraneous electromagnetic radiation), with waveform breakdown, such as overshoot or undershoot, sometimes generated in the transmitted signal. There is accordingly a need to shape the waveform of the signal by providing an emphasis circuit and a de-emphasis circuit on the signal transmission side, and providing an equalizer circuit on the signal receiving side. Increasing the number of signal lines leads to an increase in consumed current, manufacturing cost, placement surface area, and the like, and leads to interference between the signal lines.

An object of an aspect of technology disclosed herein is to increase the signal transmission volume per unit time.

SUMMARY

According to an aspect of the embodiments, a signal output device includes: an output section that is input with a base waveform signal provided with a signal level transition period within each cycle, wherein a signal level of the base waveform signal in a signal level non-transition period before or after the signal level transition period is differentiated according to a value of a first bit of output-target data, and that outputs an output signal corresponding to the input base waveform signal to an output transmission path; and a control section that, in the signal level non-transition period, matches an output impedance of the output section to a characteristic impedance of the output transmission path, and also matches the output impedance of the output section to the characteristic impedance of the output transmission path in the signal level transition period in a case in which a second bit of the output-target data is a first value, and generates a mismatch between the output impedance of the output section and the characteristic impedance of the output transmission path in the signal level transition period in a case in which the second bit of the output-target data is a second value, so as to cause generation of a change in waveform in the output signal in the signal level transition period such that the absolute value of the signal level of the output signal exceeds a preset threshold value.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Detailed explanation follows regarding an embodiment of technology disclosed herein, with reference to the drawings.

Figure 1:
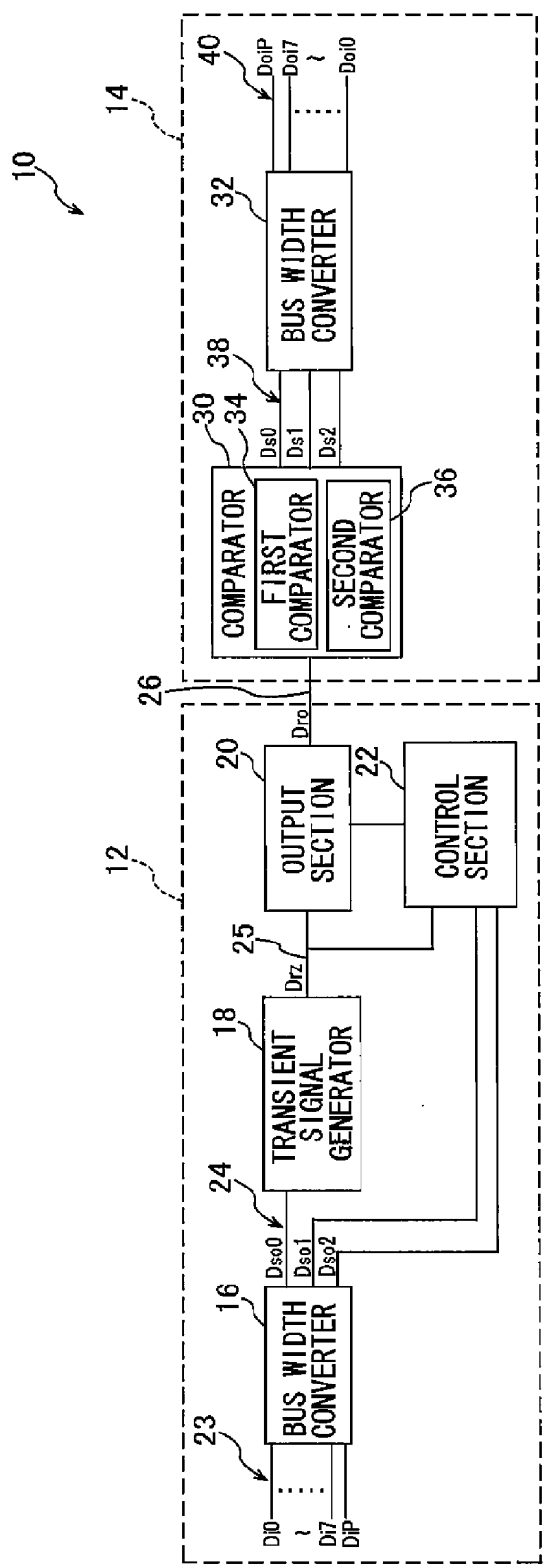
FIG. 1 is a block diagram illustrating an example of relevant configuration of a communication system according to a present exemplary embodiment.

FIG. 1 is a block diagram illustrating a configuration of a communication system 10 according to a present exemplary embodiment. The communication system 10 includes a signal output device 12 and a signal input device 14. The signal output device 12 includes a bus width converter 16, a transient signal generator 18, an output section 20, and a control section 22. The bus width converter 16 converts the bus width of a signal line. In the example illustrated in FIG. 1, as an example of the bus width converter 16, a configuration is illustrated in which a 9 bit width signal line input with a processing-target signal, an example of output-target data of technology disclosed herein, is converted into a signal line of 3 bit width. An 8 bit signal (bit signals Di0 to Di7) and a 1 bit parity signal (bit signal DiP) are employed here as an example of the processing-target signal. Bit signals Di0 to Di7 are allocated to an 8 bit width signal line within the 9 bit width signal line, and the bit signal DiP is allocated to the remaining 1 bit signal line within the 9 bit width signal line. In the bus width converter 16, a 9 bit width parallel bus 23 is connected as a signal line on the input side, and the bit signals Di0 to Di7, DiP are input through the parallel bus 23. A 3 bit width parallel bus 24 is connected to the bus width converter 16 as an output side signal line. Non Return to Zero (NRZ) binary signals (bit signals Dso0 to Dso2) corresponding to the bit signals Di0 to Di7, and DiP, input through the parallel bus 23, are output through the parallel bus 24 by the bus width converter 16.

A specific 1 bit width signal line, contained in the parallel bus 24, is connected to an input terminal of the transient signal generator 18, and the bit signal Dso0 from the bus width converter 16 is input through the 1 bit width signal line. The transient signal generator 18 generates a transient signal Drz, an example of a base waveform signal of technology disclosed herein. A 1 bit width signal line 25 is connected to the output terminal of the transient signal generator 18, and the transient signal Drz is output through the signal line 25. Note that "transient signal Drz" is, for example, a base waveform signal provided in a signal level transition period in a single cycle. The base waveform signal refers, for example, to a signal in which the signal level in the signal level non-transition periods before and after the signal level transition period are diverged according to the value of the specific bit input to the transient signal generator 18. In the present exemplary embodiment, a value of a first bit, out of first to third bits expressed by bit signals Dso0 to Dso2, is employed as an example of the "value of the specific bit". Moreover, the "signal level transition period" refers, for example, to at least one period out of a signal level rising period, or a signal level falling period in the transient signal Drz. Explanation follows regarding respective applications of the signal level rising period and the signal level falling period as the signal level transition period.

A signal line 25 is connected to the input terminal of the output section 20, and the transient signal Drz from the transient signal generator 18 is input to the output section 20. The output section 20 outputs an output signal Dro, corresponding to the input transient signal Drz, through a 1 bit width signal line 26, as an example of an output transmission path of technology disclosed herein.

The control section 22 is connected to a 2 bit width signal line in the parallel bus 24 not connected to the input terminal of the transient signal generator 18, and is input with bit signals Dso1, Dso2. Consequently, the control section 22 is input with the bit signals Dso1, Dso2 from the bus width converter 16 through the 2 bit width signal lines in synchronization with the timing at which the bit signal Dso0 is input to the transient signal generator 18 through the 1 bit width signal line. The control section 22 is connected to the transient signal generator 18 through the signal line 25. Consequently, the control section 22 is input with the transient signal Drz from the transient signal generator 18 through the signal line 25.

In the signal level non-transition period of the transient signal Drz, the control section 22 matches the output impedance of the output section 20 to the characteristic impedance of the signal line 26. If the above second bit is "0" (an example of a first value of technology disclosed herein), the output impedance of the output section 20 is matched to the characteristic impedance of the signal line 26 even during the signal level transition period (for example the signal level rising period). If the above second bit is "1" (an example of a second value of technology disclosed herein), a mismatch is generated between the output impedance of the output section 20 and the characteristic impedance of the signal line 26 during the signal level transition period (for example the signal level rising period). Due to the mismatch being generated between the output impedance of the output section 20 and the characteristic impedance of the signal line 26, waveform distortion is generated in the output signal Dro output from the output section 20 to the signal line 26 during the signal level transition period (for example the signal level rising period). Note that "waveform distortion" referred to here is, for example, waveform distortion in which the absolute value of the signal level exceeds a preset overshoot determination threshold value. Reference here to the "overshoot determination threshold value" indicates, for example, a value employed during determination as to whether or not an overshoot of a magnitude represented by "1" has been generated in the signal level rise of the transient signal Drz.

If the above third bit is "0", the control section 22 matches the output impedance of the output section 20 to the characteristic impedance of the signal line 26 even in other signal level transition periods of the transient signal Drz (for example the signal level falling period).

Furthermore, if the above third bit is "1", then in other signal level transition periods (for example the signal level falling period) the control section 22 causes a mismatch to be generated between the output impedance of the output section 20 and the characteristic impedance of the signal line 26. Due to causing a mismatch to be generated between the output impedance of the output section 20 and the characteristic impedance of the signal line 26, a waveform distortion is generated in the output signal Dro output from the output section 20 to the signal line 26 during the signal level transition period. Note that reference here to "waveform distortion" is, for example, waveform distortion in which the absolute value of the signal level exceeds a preset undershoot determination threshold value. Reference here to "undershoot determination threshold value" indicates, for example, a value employed during determining whether or not an undershoot of a magnitude represented by "1" has been generated in the signal level fall of the transient signal Drz at the signal input device 14 side.

The signal input device 14 includes a comparator 30 and a bus width converter 32. The comparator 30 is connected to the signal line 26, and is input with the output signal Dro output by the output section 20 to the signal line 26. The comparator 30 compares the absolute value of the signal level of the output signal Dro, during the period from the end of signal level rise to the start of signal level fall in the output signal Dro, against a normal determination threshold value. The comparison result is then output as bit signal Ds0.

The comparator 30 includes a first comparator 34 and a second comparator 36. The first comparator 34 compares the absolute value of the signal level of the output signal Dro output from the output section 20, during the period of signal level rise in the output signal Dro, against the overshoot determination threshold value. The comparison result is then output as bit signal Ds1. The second comparator 36 compares the absolute value of the signal level of the output signal Dro output from the output section 20 during the signal level falling period of the output signal Dro, against the undershoot determination threshold value. The comparison result is then output as bit signal Ds2.

The bus width converter 32 converts the bus width of the signal line. A situation is illustrated in the example of FIG. 1 in which a 3 bit width signal line is converted into a 9 bit width signal line, as an example of the bus width converter 32. A 3 bit width parallel bus 38 is connected to the bus width converter 32 as an input side signal line, and the bit signals Ds0 to Ds2 are input through the parallel bus 38. A 9 bit width parallel bus 40 is connected to the bus width converter 32 as an output side signal line. Consequently, the bus width converter 32 converts the bit signals Ds0 to Ds2 input through the parallel bus 38 into a 9 bit signal (bit signals Doi0 to Doi7, DoiP), and outputs the bit signals Doi0 to Doi7, and DoiP through the parallel bus 40.

Figure 2:
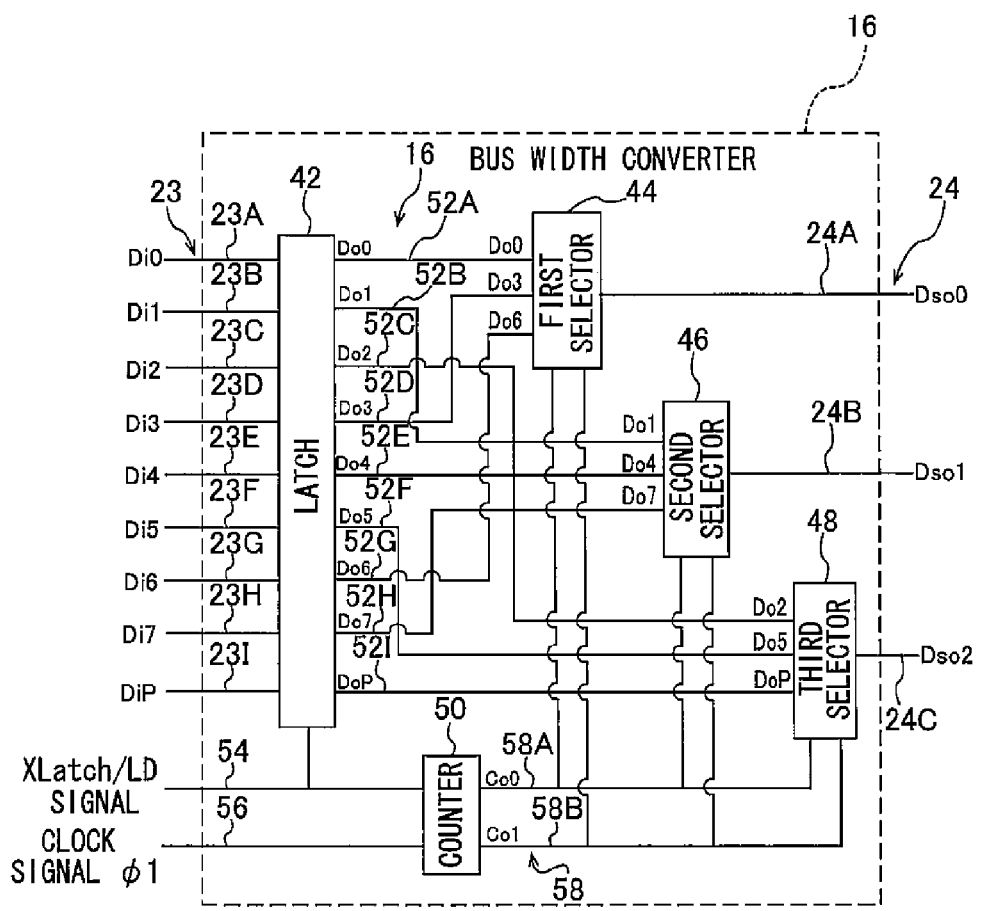
FIG. 2 is a schematic configuration diagram illustrating an example of relevant configuration of a bus width converter including a signal output device according to an exemplary embodiment.

FIG. 2 illustrates an example of a configuration of the bus width converter 16. The bus width converter 16 includes a latch 42, a first selector 44, a second selector 46, a third selector 48, and a counter 50. The parallel bus 23 is connected to the latch 42 as an input side bus, and a 9 bit width parallel bus 52 is connected to the latch 42 as an output side signal line. The parallel bus 23 includes the signal lines 23A to 23H that are respectively input with the bit signals Di0 to Di7 as 1 bit units, and a signal line 23I input with a bit signal DiP. The parallel bus 52 includes the signal lines 52A to 52I corresponding to the signal lines 23A to 23I.

The latch 42 holds the bit signals Di0 to Di7, and DiP that have been input by the signal lines 23A to 23I. The bit signals Di0 to Di7, and DiP are output through the corresponding signal lines 52A to 52I in 1 bit units as bit signals Do0 to Do7, and DoP. Note that, unless explanation discriminating between the bit signals Di0 to Di7, and DiP is necessary, these are referred to below as "bit signals DiX", and unless explanation discriminating between the bit signal lines Do0 to Do7, and signal line DoP is necessary, these are referred to below as "signal lines DoX".

Signal lines 52A, 52D, and 52G are connected to the first selector 44, and the bit signals Do0, Do3, and Do6 from the latch 42 are input thereto. Signal lines 52B, 52E, 52H are connected to the second selector 46, and the bit signals Do1, Do4, Do7 from the latch 42 are input thereto. Signal lines 52C, 52E, 52H are connected to the third selector 48, and the bit signals Do2, Do5, DoP from the latch 42 are input thereto The operation of the bus width converter 16 is illustrated in FIG. 1.

TABLE 1

| | Latch | | | Counter | | | First to Third Selectors | | | | |
|---|---|---|---|---|---|---|---|---|---|---|---|
| Input | XLatch/ LD | Output (DoX) | Clock $\phi 1$ | XLatch/ LD | Co1 | Co0 | Co1 | Co0 | Dso0 | Dso1 | Dso2 |
| Di0~DiP | 1 | through | ↓ (edge) | 0 | 0 | 0 | 0 | 0 | Do0 | Do1 | Do2 |
| Di0~DiP | ↓ (edge) | latch | ↓ (edge) | 1 | 0 | 1 | 0 | 1 | Do3 | Do4 | Do5 |
| Di0~DiP | 0 | keep | ↓ (edge) | 1 | 1 | 0 | 1 | 0 | Do6 | Do1 | DoP |
| Di0~DiP | ↑ (edge) | through | ↓ (edge) | 1 | 1 | 1 | 1 | 1 | X | X | X |

A signal line 54 input with a through latch load signal (XLatch/LDsignal) is connected to the latch 42 and the counter 50. As indicated in Table 1, if the signal level of the XLatch/LDsignal is "1", then the latch 42 allows through and outputs the input bit signal DiX to the parallel bus 52 as bit signal DoX. As indicated in Table 1, the input bit signal Dix is latched at the signal level fall of the XLatch/LDsignal. As indicated in Table 1, if the signal level of the XLatch/LDsignal is "0", then the input bit signal Dix is kept. As indicated in Table 1, the latch 42 allows through the input bit signal at the signal level rise of the XLatch/LDsignal.

A signal line 56 is also connected to the counter 50, and a clock signal $\phi 1$ is input to the signal line 56. The counter 50 includes a 2 bit width parallel bus 58 that outputs a 2 bit logical value defined by the clock signal $\phi 1$ and the XLatch/LDsignal. The parallel bus 58 includes signal lines 58A, 58B, and the counter 50 is respectively connected to the first to third selectors 44, 46, 48 through the signal lines 58A, 58B.

As indicated in Table 1, if the XLatch/LDsignal is "0", the counter 50 outputs a bit signal Co0 representing "0" to the first to third selectors 44, 46, 48 through the signal line 58A at the signal level fall of the clock signal $\phi 1$. The counter 50 also outputs a bit signal Co1 representing "0" to the first to third selectors 44, 46, 48 through the signal line 58B.

Thereafter, as illustrated in Table 1, if the XLatch/LDsignal is "1", the counter 50 outputs a bit signal Co0 representing "0" to the first to third selectors 44, 46, 48 through the signal line 58A at the signal level fall timing of the clock signal $\phi 1$. The counter 50 also outputs a bit signal Co1 representing "1" to the first to third selectors 44, 46, 48 through the signal line 58B.

Thereafter, as illustrated in Table 1, if the XLatch/LDsignal is maintained in a state of "1", the counter 50 outputs a bit signal Co0 representing "1" to the first to third selectors 44, 46, 48 through the signal line 58A at the next signal level fall of the clock signal $\phi 1$. The counter 50 also outputs a bit signal Co1 representing "0" to the first to third selectors 44, 46, 48 through the signal line 58B.

Thereafter, as illustrated in Table 1, at the next signal level fall of the clock signal $\phi 1$, the counter 50 outputs the bit signals Co0, Co1 representing "1" to the first to third selectors 44, 46, 48 through the signal lines 58A, 58B.

The parallel bus 24 includes signal line 24A to 24C. The signal line 24A is connected to the first selector 44, the signal line 24B is connected to the second selector 46, and the signal line 24C is connected to the third selector 48. Thus, as illustrated in Table 1, the first selector 44, the second selector 46, and the third selector 48 output the bit signals Do0 to Do7, and DoP as bit signals Dso0 to Dso2, according to the logical values represented by each of the input bit signals Co0, Co1.

Namely, if the first selector 44 is input with the bit signals Co0, Co1 representing "0" from the counter 50 through the signal lines 58A, 58B respectively, the first selector 44 outputs the bit signal Do0 through the signal line 24A as the bit signal Dso0. If the first selector 44 is input with the bit signals Co0 representing "1" and the bit signal Co1 representing "0" from the counter 50, the first selector 44 outputs the bit signal Do3 through the signal line 24A as the bit signal Dso0. If the first selector 44 is input with the bit signals Co0 representing "0" and the bit signal Co1 representing "1" from the counter 50, the first selector 44 outputs the bit signal Do6 through the signal line 24A as the bit signal Dso0.

If the second selector 46 is input with the bit signals Co0, Co1 representing "0" from the counter 50 through the signal lines 58A, 58B respectively, the second selector 46 outputs the bit signal Do1 through the signal line 24B as the bit signal Dso1. If the second selector 46 is input with the bit signals Co0 representing "1" and the bit signal Co1 representing "0" from the counter 50, the second selector 46 outputs the bit signal Do4 through the signal line 24B as the bit signal Dso1. If the second selector 46 is input with the bit signals Co0 representing "0" and the bit signal Co1 representing "1" from the counter 50, the second selector 46 outputs the bit signal Do7 through the signal line 24B as the bit signal Dso1.

If the third selector 48 is input with the bit signals Co0, Co1 representing "0" from the counter 50 through the signal lines 58A, 58B respectively, the third selector 48 outputs the bit signal Do2 through the signal line 24C as the bit signal Dso1. If the third selector 48 is input with the bit signals Co0 representing "1" and the bit signal Co1 representing "0" from the counter 50, the third selector 48 outputs the bit signal Do5 through the signal line 24C as the bit signal Dso2. If the third selector 48 is input with the bit signals Co0 representing "0" and the bit signal Co1 representing "1" from the counter 50, the third selector 48 outputs the bit signal DoP through the signal line 24C as the bit signal Dso2.

Figure 3:
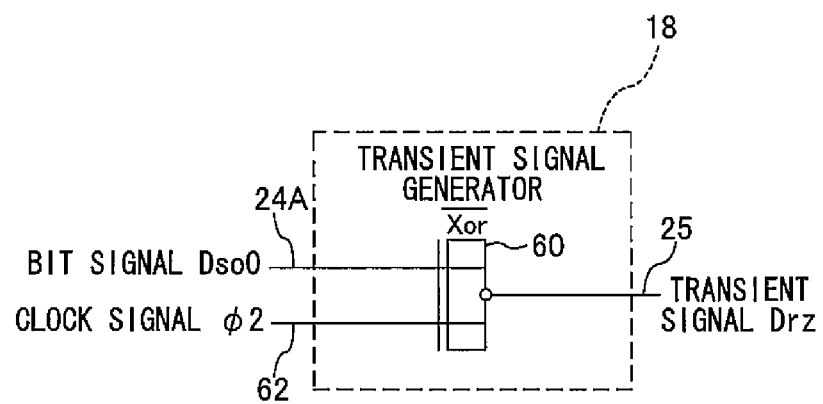
FIG. 3 is a schematic configuration diagram illustrating an example of relevant configuration of a transient signal generator including a signal output device at an exemplary embodiment.

FIG. 3 illustrates an example of a configuration of the transient signal generator 18. The transient signal generator 18 includes a combination logic circuit 60. The combination logic circuit 60 is a circuit that inverts an exclusive OR. A specific signal line out of the signal lines 24A to 24C is connected to one input terminal of the combination logic circuit 60. In the present exemplary embodiment, as an example, the signal line 24A is connected to the one input terminal of the combination logic circuit 60. A signal line 62, input with the clock signal $\phi 2$, is connected to the other input terminal of the combination logic circuit 60. In the present exemplary embodiment, as an example of the clock signal $\phi 2$, a signal is employed that is the clock signal $\phi 1$ delayed by ¼ cycle.

The signal line 25 is connected to the output terminal of the combination logic circuit 60. Thus the combination logic circuit 60 outputs a bit signal representing the logical value of the inverted exclusive OR from the logical value represented by the bit signal Dso0 and the logical value represented by the clock signal $\phi 2$, through the signal line 25 as the transient signal Drz. Table 2 indicates logical values (output values) of the inverted exclusive OR from the logical value (input value) represented by the bit signal Dso0 input from the signal line 24A, and the logical value (input value) represented by the clock signal $\phi 2$ input from the signal line 62.

TABLE 2

| Input Value | | Output Value |
|---|---|---|
| DsoX | Clock $\phi 2$ | DrzX |
| 0 | 0 | 1 |
| 0 | 1 | 0 |
| 1 | 0 | 0 |
| 1 | 1 | 1 |

Namely, if the logical value of the bit signal Dso0 input from the signal line 24A is "0" and the logical value of the clock signal $\phi 2$ input from the signal line 62 is "0", the logical value of the transient signal Drz is "1". If the logical value of the bit signal Dso0 input from the signal line 24A is "0" and the logical value of the clock signal $\phi 2$ input from the signal line 62 is "1", the logical value of the transient signal Drz is "0". If the logical value of the bit signal Dso0 input from the signal line 24A is "1" and the logical value of the clock signal $\phi 2$ input from the signal line 62 is "0", the logical value of the transient signal Drz is "0". If the logical value of the bit signal Dso0 input from the signal line 24A is "1" and the logical value of the clock signal $\phi 2$ input from the signal line 62 is "1", the logical value of the transient signal Drz is "1".

Figure 4:
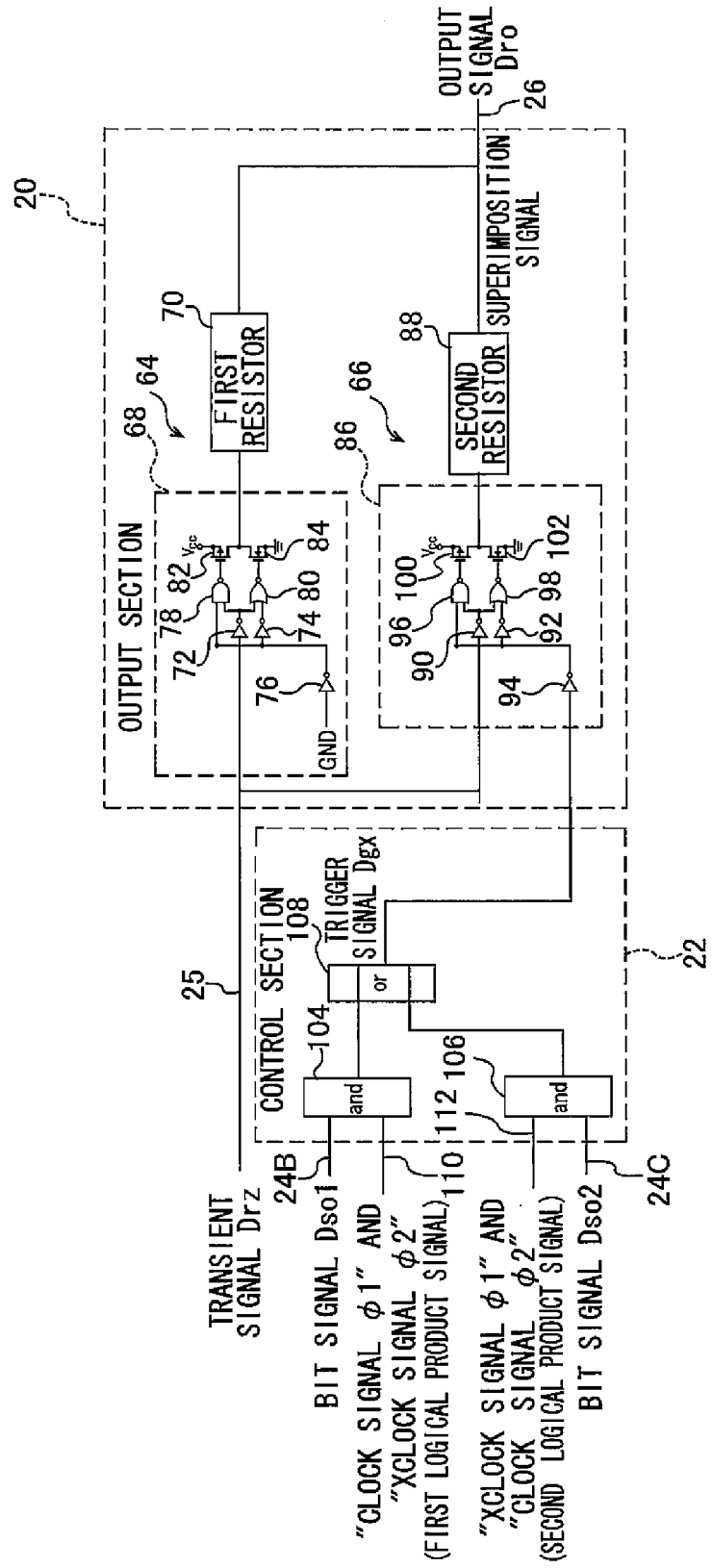
FIG. 4 is a schematic configuration diagram illustrating an example of relevant configuration of an output section and a control section included in a signal output device according to an exemplary embodiment.

FIG. 4 illustrates an example of a configuration of the output section 20 and the control section 22. The output section 20 includes a first output section 64, and a second output section 66. The first output section 64 is input with the transient signal Drz through the signal line 25, and outputs to the signal line 26 the output signal Dro corresponding to the input transient signal Drz at an output impedance matched to the characteristic impedance of the signal line 26.

The first output section 64 includes a first drive circuit 68 and a first resistor 70. The first drive circuit 68 includes NOT circuits 72, 74, 76, a NAND circuit 78, a NOR circuit 80, a PMOS transistor 82, and an NMOS transistor 84. The signal line 25 is connected to the input terminal of the NOT circuit 72. The output terminal of the NOT circuit 72 is connected to one of the input terminals of the NAND circuit 78 and to one of the input terminals of the NOR circuit 80. The input terminal of the NOT circuit 76 is connected to ground. The output terminal of the NOT circuit 76 is connected to the input terminal of the NOT circuit 74 and the other input terminal of the NAND circuit 78. The output terminal of the NOT circuit 74 is connected to the other input terminal of the NOR circuit 80. The output terminal of the NAND circuit 78 is connected to the gate of the PMOS transistor 82. The output terminal of the NOR circuit 80 is connected to the gate of the NMOS transistor 84. The drains of the PMOS transistor 82 and the NMOS transistor 84 are connected together, the source of the PMOS transistor 82 is supplied with a drive voltage VCC, and the source of the NMOS transistor 84 is connected to ground. The connection point between the drain of the PMOS transistor 82 and the drain of the NMOS transistor 84 is connected to one end of a first resistor 70. The signal line 26 is connected to the other end of the first resistor 70.

The first drive circuit 68 generates the output signal Dro corresponding to the transient signal Drz input through the signal line 25, and outputs the generated output signal Dro to the signal line 26. The first resistor 70 has an electrical resistance value determined such that the output impedance of the first output section 64 matches the characteristic impedance of the signal line 26. Thus by outputting the output signal Dro to the signal line 26 by the first drive circuit 68 through the first resistor 70, the output signal Dro is output to the signal line 26 at an output impedance matched to the characteristic impedance of the signal line 26.

The second output section 66 is input with the transient signal Drz, and is capable of outputting to the signal line 26 a signal, equivalent to the output signal Dro corresponding to the input transient signal Drz, at a smaller output impedance then the output impedance of the first output section 64.

The second output section 66 includes a second drive circuit 86 and a second resistor 88. The second drive circuit 86 includes NOT circuits 90, 92, 94, NAND circuit 96, NOR circuit 98, a PMOS transistor 100, and an NMOS transistor 102. The signal line 25 is connected to the input terminal of the NOT circuit 90. The output terminal of the NOT circuit 90 is connected to one of the input terminals of the NAND circuit 96 and to one of the input terminals of the NOR circuit 98. The output terminal of the NOT circuit 94 is connected to the input terminal of the NOT circuit 92 and the other input terminal of the NAND circuit 96. The output terminal of the NOT circuit 92 is connected to the other input terminal of the NOR circuit 98. The output terminal of the NAND circuit 96 is connected to the gate of the PMOS transistor 100. The output terminal of the NOR circuit 98 is connected to the gates of the NMOS transistor 102. The drains of the PMOS transistor 100 and the NMOS transistor 102 are connected together, the source of the PMOS transistor 100 is supplied with a drive voltage VCC, and the source of the NMOS transistor 102 is connected to ground. The connection point between the drain of the PMOS transistor 100 and the drain of the NMOS transistor 102 is connected to one end of a second resistor 88. The signal line 26 is connected to the other end of second resistor 88. The second resistor 88 has an electrical resistance value determined such that the output impedance of the second output section 66 is smaller than the output impedance of the first output section 64.

If a trigger signal Dgx is input to the input terminal of the NOT circuit 94, the second output section 66 generates a signal equivalent to an output signal, and outputs the generated signal through the second resistor 88 to the signal line 26. The "trigger signal Dgx" referred to above is, for example, a signal equivalent to a signal input to the input terminal of the NOT circuit 76 (as an example of a signal representing a ground voltage value GND). If the signal equivalent to the output signal generated by the second drive circuit 86 is output through the second resistor 88 to the signal line 26, a mismatch is generated between the characteristic impedance of the signal line 26 and the output impedance of the output section 20. Accordingly, by selectively causing a mismatch to be generated between the characteristic impedance of the signal line 26 and the output impedance of the output section 20, a signal equivalent to the output signal output from the second drive circuit 86 through the second resistor 88 can be superimposed on the output signal Dro. For ease of explanation, the signal output from the second output section 66 and superimposed on the output signal Dro output from the first output section 64 is referred to below as the "superimposition signal".

As illustrated in Table 3, the logical value of the superimposition signal is determined according to the logical value of the transient signal Drz and the logical value of the trigger signal Dgx. Namely, the logical value of the superimposition signal is "0" in cases in which the logical value of the transient signal Drz is "0" and the logical value of the trigger signal Dgx is "0". The logical value of the superimposition signal is "1" in cases in which the logical value of the transient signal Drz is "1" and the logical value of the trigger signal Dgx is "0". The logical value of the superimposition signal is high impedance (Z) in cases in which the logical value of the transient signal Drz is "0" and the logical value of the trigger signal Dgx is "1". The logical value of the superimposition signal is high impedance in cases in which the logical value of the transient signal Drz is "1" and the logical value of the trigger signal Dgx is "1".

TABLE 3

| Input | | Output |
|---|---|---|
| Transient Signal Drz | Trigger Signal Dgx | Superimposition Signal |
| 0 | 0 | 0 |
| 1 | 0 | 1 |
| 0 | 1 | Z |
| 1 | 1 | Z |

By supplying the trigger signal Dgx to the input terminal of the NOT circuit 94 during the signal level non-transition period of the transient signal Drz, the control section 22 controls the output section 20 such that there is a non-output state in which the superimposition signal is not output from the second output section 66. By not supplying the trigger signal Dgx to the input terminal of the NOT circuit 94 in cases in which the above second bit is "0", the control section 22 controls the output section 20 such that a non-output state is also adopted even during a signal level transition period during which the signal level rises. By not supplying the trigger signal Dgx to the input terminal of the NOT circuit 94 in cases in which the above third bit is "0", the control section 22 controls the output section 20 such that a non-output state is also adopted even during a signal level transition period during which the signal level falls. By supplying the trigger signal Dgx to the input terminal of the NOT circuit 94 in cases in which the above second bit is "1", the control section 22 controls the output section 20 so as to adopt an output state in which the superimposition signal is output by the second output section 66 during the signal level transition period during which the signal level rises. By supplying the trigger signal Dgx to the input terminal of the NOT circuit 94 in cases in which the 3 bit above is "1", the control section 22 controls the output section 20 such that an output state is adopted during the signal level transition period during which the signal level falls.

The control section 22 includes AND circuits 104, 106, and an OR circuit 108. The signal line 24B is connected to one input terminal of the AND circuit 104. A signal line 110 is connected to the other input terminal of the AND circuit 104, and a bit signal is input through the signal line 110 representing a logical product of the logical value of the clock signal φ1 and the inverted value of the logical value of the clock signal φ2. Note that for ease of explanation, the bit signal representing a logical product of the logical value of the clock signal φ1 and the inverted value of the logical value of the clock signal φ2 is referred to as "first logical product signal".

The output terminal of the AND circuit 104 is connected to one input terminal of the OR circuit 108. The signal line 24C is connected to one input terminal of the AND circuit 106. The signal line 112 is connected to the other input terminal of the AND circuit 106, and the bit signal representing a logical product of the inverted value of the logical value of the clock signal φ1 and the logical value of the clock signal φ2 is input through the signal line 112. For ease of explanation, the bit signal representing a logical product of the inverted value of the logical value of the clock signal φ1 and the logical value of the clock signal φ2 is referred to as the "second logical product signal".

The output terminal of the AND circuit 104 is connected to the other input terminal of the OR circuit 108. The output terminal of the OR circuit 108 is connected to the input terminal of the NOT circuit 94 of the second drive circuit 86. Accordingly, the OR circuit 108 supplies, as the trigger signal Dgx, a bit signal representing the logical sum of the logical value input from the AND circuit 104 and the logical value input from the AND circuit 106 to the input terminal of the NOT circuit 94.

Figure 5:
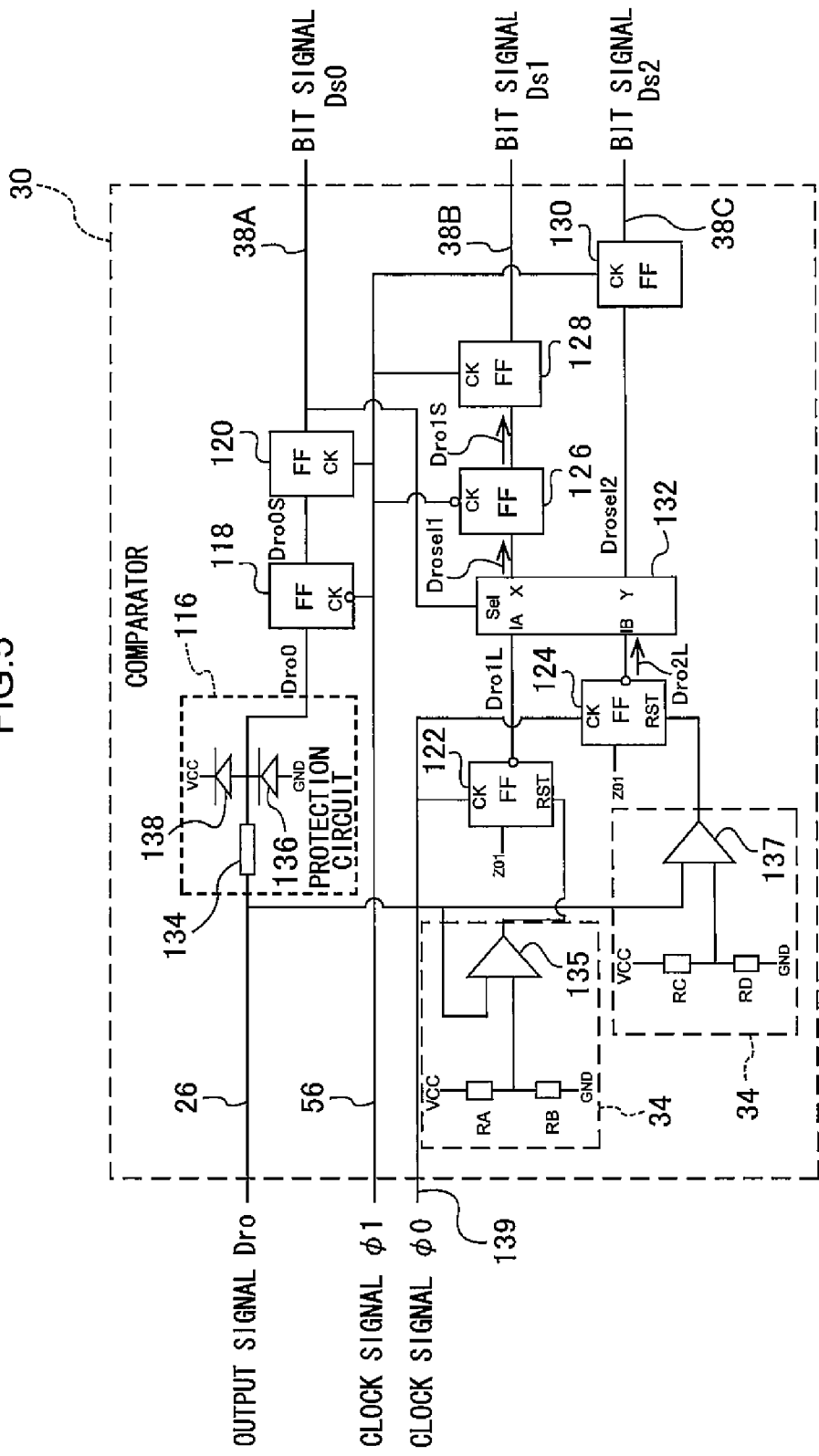
FIG. 5 is a schematic configuration diagram illustrating an example of relevant configuration of a comparator included in a signal input device according to an exemplary embodiment.

FIG. 5 illustrates an example of a configuration of the comparator 30. The comparator 30 includes a first comparison section 34, a second comparison section 36, a protection circuit 116, flip-flop circuits (referred to below as FF circuits) 118, 120, 124, 126, 128, 130, and a selector 132. The parallel bus 38 includes signal lines 38A to 38C.

The protection circuit 116 includes a resistor 134 and diodes 136, 138. The diodes 136, 138 are connected together in series. The anode of the diode 136 is connected to ground, and the cathode of the diode 138 is supplied with drive voltage VCC. One end of the resistor 134 is connected to the connection point of the diodes 136, 138, and the other end of the resistor 134 is connected to the signal line 26. Only the signal component of the input output signal Dro having a wave height value greater than a normal determination threshold value is output as a bit signal Dro0 by the thus configured protection circuit 116.

The FF circuit 118 includes an input terminal, an inverted clock terminal, and an output terminal. The input terminal of the FF circuit 118 is connected to the connection point between the diodes 136, 138. The bit signal Dro0 output from the protection circuit 116 is input to the input terminal of the FF circuit 118. The signal line 56 is connected to the inverted clock terminal of the FF circuit 118. A signal of the inverted clock signal $\phi 1$ is input to the FF circuit 118 through the inverted clock terminal. Accordingly, the FF circuit 118 outputs a bit signal Dro0S, representing a logical value equivalent to the logical value of the bit signal Dro0 input to the input terminal, through the output terminal according to the inverted signal of the clock signal $\phi 1$ input to the inverted clock terminal.

The FF circuit 120 includes an input terminal, a clock terminal, and an output terminal. The output terminal of the FF circuit 118 is connected to the input terminal of the FF circuit 120, and the bit signal Dro0S output from the output terminal of the FF circuit 118 is input thereto. The signal line 56 is connected to the clock terminal of the FF circuit 120, and the clock signal $\phi 1$ is input thereto. The signal line 38A is connected to the output terminal of the FF circuit 120. The FF circuit 120 outputs through the output terminal the bit signal Dro0S input to the input terminal, as the bit signal Ds0 to the signal line 38A according to the clock signal $\phi 1$ input to the clock terminal.

The first comparator 34 includes resistors RA, RB, and a comparator 135. One end of the resistor RA is connected to one end of the resistor RB. The other end of the resistor RB is connected to ground, and the other end of the resistor RA is supplied with the drive voltage VCC. One input terminal of the comparator 135 is connected to the connection point between the resistors RA, RB, and is supplied with a constant voltage divided from the drive voltage VCC by the resistors RA, RB. The signal line 26 is connected to the other input terminal of the comparator 135, and the output signal output from the output section 20 is input thereto. The comparator 135 accordingly outputs, through the output terminal thereof, a signal representing a comparator result between the voltage value of the output signal Dro input from the output section 20 through the signal line 26, and the divided voltage divided from the drive voltage VCC by the resistors RA, RB (an example of the above "overshoot determination threshold value").

The FF circuit 122 includes an input terminal, a clock terminal, a reset terminal, and an inverting output terminal. A pull-up resistor Z01 is connected to the input terminal, and a logical value "1" is input thereto. A signal line 139 is connected to the clock terminal, and a clock signal $\phi 0$ (a signal with a frequency of twice the clock signal $\phi 1$) is input through the signal line 139. The output terminal of the comparator 135 is connected to the reset terminal Thus, as long as the logical value of the signal input to the reset terminal from the comparator 135 is "1", irrespective of the clock signal $\phi 0$ input to the clock terminal, the FF circuit 122 inverts and then outputs a bit signal representing "1" using the inverting output terminal. As long as the logical value of the signal input to the reset terminal is "0", the FF circuit 122 inverts and then outputs a bit signal representing a logical value based on the logical value representing the clock signal $\phi 0$ input to the clock terminal, and the "1" of the logical value input to the pull-up terminal, using the inverting output terminal. The bit signal output from the FF circuit 122 is referred to below as a bit signal Dro1L.

The second comparator 36 includes resistors RC, RD and a comparator 137. One end of the resistor RC is connected to one end of the resistor RD. The other end of the resistor RD is connected to ground, and the other end of the resistor RC is supplied with the drive voltage VCC. One input terminal of the comparator 137 is connected to the connection point between the resistors RC, RD, and is supplied with a constant voltage divided from the drive voltage VCC by the resistors RC, RD. The signal line 26 is connected to the other input terminal of the comparator 137, and the output signal Dro output from the output section 20 is input thereto. The comparator 137 accordingly outputs, through the output terminal thereof, a signal representing a comparator result between the voltage value of the output signal Dro input from the output section 20 through the signal line 26, and the divided voltage divided from the drive voltage VCC by the resistors RC, RD (an example of the above "undershoot determination threshold value").

The FF circuit 124 includes an input terminal, a clock terminal, a reset terminal, and an inverting output terminal. A pull-up resistor Z01 is connected to the input terminal, and a logical value "1" is input thereto. A signal line 139 is connected to the clock terminal, and the clock signal $\phi 0$ is input thereto through the signal line 139. The output terminal of the comparator 137 is connected to the reset terminal. Thus, as long as the logical value of the signal input to the reset terminal from the comparator 137 is "1", irrespective of the clock signal $\phi 0$ input to the clock terminal, the FF circuit 124 inverts then outputs the bit signal representing "1" using the inverting output terminal. As long as the logical value of the signal input to the reset terminal is "0", the FF circuit 124 inverts and then outputs a bit signal representing a logical value based on the logical value representing the clock signal $\phi 0$ input to the clock terminal and the "1" of the logical value input to the pull-up terminal, using the inverting output terminal. The bit signal output from the FF circuit 124 is referred to below as a bit signal Dro2L.

The selector 132 includes a select terminal Sel, input terminals IA, IB, and output terminals X, Y. The output terminal of the FF circuit 120 is connected to the select terminal Sel. The inverting output terminal of the FF circuit 122 is connected to the input terminal IA, and the inverting output terminal of the FF circuit 124 is connected to the input terminal IB. As illustrated in Table 4, the selector 132 switches the logical value of the bit signals output respectively from the output terminals X, Y according to the logical value of the bit signal input to the select terminal Sel. Namely, in cases in which the logical value of the bit signal input to the select terminal Sel is "0", if DataA is input to the input terminal IA, and DataB is input to the input terminal IB, the DataA is output through the output terminal X, and the DataB is output through the output terminal Y. In cases in which the logical value of the bit signal input to the select terminal Sel is "1", if DataA is input to the input terminal IA, and DataB is input to the input terminal IB, the DataB is output through the output terminal X, and the DataA is output through the output terminal Y. The bit signal output from the output terminal X is referred to below as bit signal Drosel 1, and the bit signal output from the output terminal Y is referred to below as bit signal Drosel 2.

TABLE 4

| Input | | | Output | |
|---|---|---|---|---|
| IA | IB | Sel | X | Y |
| DataA | DataB | 0 | DataA | DataB |
| DataA | DataB | 1 | DataB | DataA |

The FF circuit 126 includes an input terminal, an inverted clock terminal, and an output terminal. The output terminal X of the selector 132 is connected to the input terminal of the FF circuit 126, and a bit signal Drosel 1 output from the output terminal X is input thereto. The signal line 56 is connected to the inverted clock terminal of the FF circuit 126, and the inverted signal of the clock signal ϕ1 is input to the FF circuit 126 through the inverted clock terminal. The FF circuit 126 accordingly outputs, through the output terminal thereof, a bit signal Dro1S, representing the same logical value as the logical value of the bit signal Drosel 1 input to the input terminal thereof, according to an inverted signal of the clock signal ϕ1 input to the inverted clock terminal thereof.

The FF circuit 128 includes an input terminal, a clock terminal, and an output terminal. The output terminal of the FF circuit 126 is connected to the input terminal of the FF circuit 128, and a bit signal Dro1S is input thereto. The signal line 56 is connected to the clock terminal of the FF circuit 128, and the clock signal ϕ1 is input thereto. A signal line 38B is connected to the output terminal of the FF circuit 128. The FF circuit 128 accordingly outputs, through the output terminal thereof, a bit signal Dro1 S, input to the input terminal thereof, to the signal line 38B as a bit signal Ds1 according to the clock signal ϕ1 input to the clock terminal thereof.

The FF circuit 130 includes an input terminal, a clock terminal, and an output terminal. The output terminal Y of the selector 132 is connected to the input terminal of the FF circuit 130, and the bit signal Drosel 2 output from the output terminal Y is input to thereto. The signal line 56 is connected to the clock terminal of the FF circuit 130, and the clock signal ϕ1 is input thereto. The signal line 38C is connected to the output terminal of the FF circuit 130. The FF circuit 130 accordingly outputs, through the output terminal thereof, a bit signal Drosel 2, input to the input terminal thereof, to the signal line 38C as a bit signal Ds2 according to the clock signal ϕ1 input to the clock terminal thereof.

Figure 6:
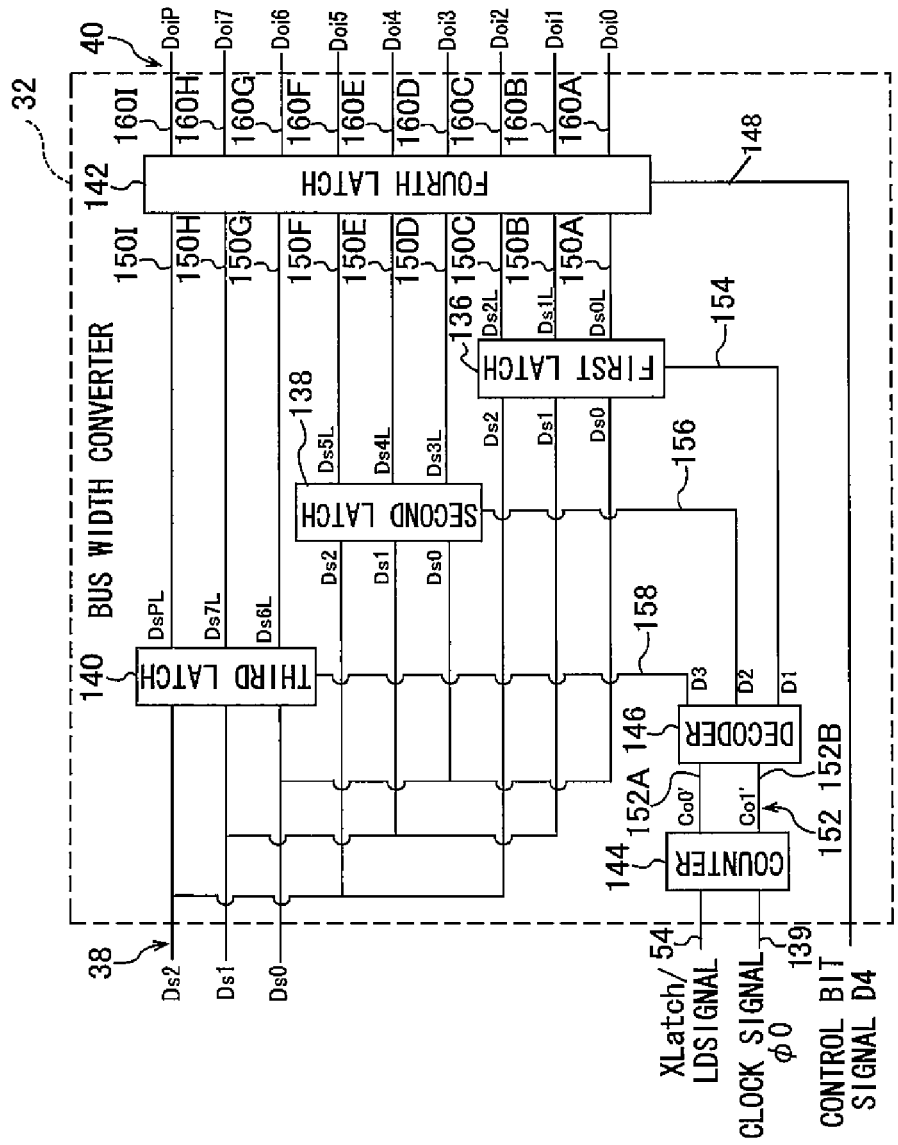
FIG. 6 is a schematic configuration diagram illustrating an example of relevant configuration of a bus width converter included in a signal input device according to an exemplary embodiment.

FIG. 6 illustrates an example of relevant configuration of the bus width converter 32. The bus width converter 32 includes first to fourth latches 136, 138, 140, 142, a counter 144, and a decoder 146. A serial bus 38 is respectively connected to the first to third latches 136, 138, 140. The first latch 136 is connected to the fourth latch 142 through the signal lines 150A to 150C corresponding to the signal lines 23A to 23C (see FIG. 2). The second latch 138 is connected to the fourth latch 142 through signal lines 150D to 150F corresponding to the signal lines 23D to 23F (see FIG. 2). The third latch 140 is connected to the fourth latch 142 through signal lines 150G to 150I corresponding to the signal lines 23G to 23I (see FIG. 2).

The signal lines 54, 139 are connected to the counter 144. The counter 144 includes a 2 bit width parallel bus 152. The parallel bus 152 includes signal lines 152A, 152B, and the counter 144 is connected to the decoder 146 through signal lines 152A, 152B. The decoder 146 is individually connected to the first latch 136 through the signal line 154, to the second latch 138 through the signal line 156, and to the third latch 140 through the signal line 158.

Operation of the bus width converter 32 is illustrated in Table 5 below.

TABLE 5

| First to Third Latches | | | Counter | | | Decoder | | | | |
|---|---|---|---|---|---|---|---|---|---|---|
| Input | XLatch/LD | Output | Clock ϕ1 | XLatch/LD | Co1 | Co0 | Co1 | Co0 | D1 | D2 | Ds3 |
| DsX | 0 | through | ↓ (edge) | 0 | 0 | 0 | 0 | 0 | 0 | 1 | 1 |
| Dsx | ↑ (edge) | latch | ↓ (edge) | 1 | 0 | 1 | 0 | 1 | 1 | 0 | 1 |
| Dsx | 1 | keep | ↓ (edge) | 1 | 1 | 0 | 1 | 0 | 1 | 1 | 0 |
| Dsx | ↓ (edge) | through | ↓ (edge) | 1 | 1 | 1 | 1 | 1 | 1 | 1 | 1 |

As indicated in Table 5, the counter 144 outputs bit signals Co0', Co1' representing logical values determined by the logical value of the XLatch/LDsignal and the logical value of the clock signal ϕ0. Namely, in cases in which the logical value of the XLatch/LDsignal is "0", then when the time arrives for the first fall of the signal level of the clock signal ϕ0, the counter 144 outputs the bit signals Co0', Co1' representing "0" to the signal lines 152A, 152B, respectively. When the time arrives for the second fall of the signal level of the clock signal ϕ0, the counter 144 outputs bit signal Co0' representing "1" to the signal line 152A, together with outputting the bit signal Co1' representing "0" to the signal line 152B. When the time arrives for the third fall of the signal level of the clock signal ϕ0, the counter 144 outputs bit signal Co0' representing "0" to the signal line 152A, together with outputting the bit signal Co1' representing "1" to the signal line 152B. When the time arrives for the fourth fall of the signal level of the clock signal ϕ0, the counter 144 respectively outputs bit signals Co0', Co1' representing "1" to the signal lines 152A, 152B.

As indicated in Table 5, bit signals D1 to D3 representing the logical values determined according to the bit signals Co0', Co1' input through the parallel bus 152 are output to the signal lines 154, 156, 158 by the decoder 146. Namely, if the logical value of bit signal Co0' input to the signal line 152A and the logical value represented by the bit signal Co1' input to the signal line 152B are both "0", then the bit signal D1 representing "0" is output to the signal line 154. Moreover, the bit signals D2, D3 representing "1" are respectively output to the signal lines 156, 158.

Moreover, in cases in which the logical value of the bit signal Co0' is "1", and the logical value of the bit signal Co1' is "0", the decoder 146 outputs the bit signal D2 representing "0" to the signal line 156. The decoder 146 also respectively outputs the bit signals D1, D3 representing "1" to the signal lines 154, 158.

In cases in which the logical value of the bit signal Co0' is "0", and the logical value of the bit signal Co1' is "1", the decoder 146 outputs the bit signal D3 representing "0" to the signal line 158. The decoder 146 also respectively outputs the bit signals D1, D2 representing "1" to the signal lines 154, 156.

In cases in which the logical value represented by the bit signal Co0' and the logical value by the bit signal Co1' are both "1", the decoder 146 outputs bit signals representing "1" to the signal lines 154, 156, 158.

As indicated in Table 5, in cases in which the logical value of the XLatch/LDsignal is "0", the respective first to third latches 136, 138, 140 allows through and outputs the bit signals Ds0 to Ds2 input from the parallel bus 38 to the fourth latch 142. As illustrated in Table 5, the bit signals Ds0 to Ds2 input from the parallel bus 38 are latched at the rise of the signal of the XLatch/LDsignal. As indicated in Table 5, in cases in which the logical value of the XLatch/LDsignal is "1", each of the first to the third latches 136, 138, 140 keeps the bit signals Ds0 to Ds2 input from the serial bus 38. As indicated in Table 1, the bit signals Ds0 to Ds2 are through-output from the serial bus 38 to the fourth latch 142 when the logical value of the XLatch/LDsignal falls.

The parallel bus 40 is connected to the fourth latch 142. The parallel bus 40 includes signal lines 160A to 160I corresponding to the signal lines 150A to 150I. Note that unless explanation discriminating between the individual signal lines 150A to 150I is necessary, they are referred to as the signal lines 150, and unless explanation discriminating between the individual signal lines 160A to 160I is necessary, they are referred to as the signal lines 160.

A signal line 148 is connected to the fourth latch 142, and a control bit signal D4 is input to the signal line 148 to control operation of the fourth latch 142. The fourth latch 142 respectively outputs bit signals Ds0L to Ds7L, DsPL input through the signal lines 150 to the corresponding signal lines 160 according to the control bit signal D4 input through the signal line 148. Here, as an example of the control bit signal D4, the bit signal D3 is input, and a bit signal is employed that represents the logical sum of the input bit signal D3 output through a D-FF circuit, operating according to the clock signal $\phi 0$, and the clock signal $\phi 0$. In such cases, if the logical value of the input control bit signal D4 is "1", then the bit signals input through the signal lines 150 are latched. In contrast thereto, if the logical value of the input control bit signal D4 is "0", then the bit signals already latched at that current point in time are output to the parallel bus 40.

Explanation next follows regarding operation of the communication system 10. Explanation follows regarding a case in which "10101011P (=1)" is employed as an example of a processing-target signal input to the bus width converter 16.

Figure 7:
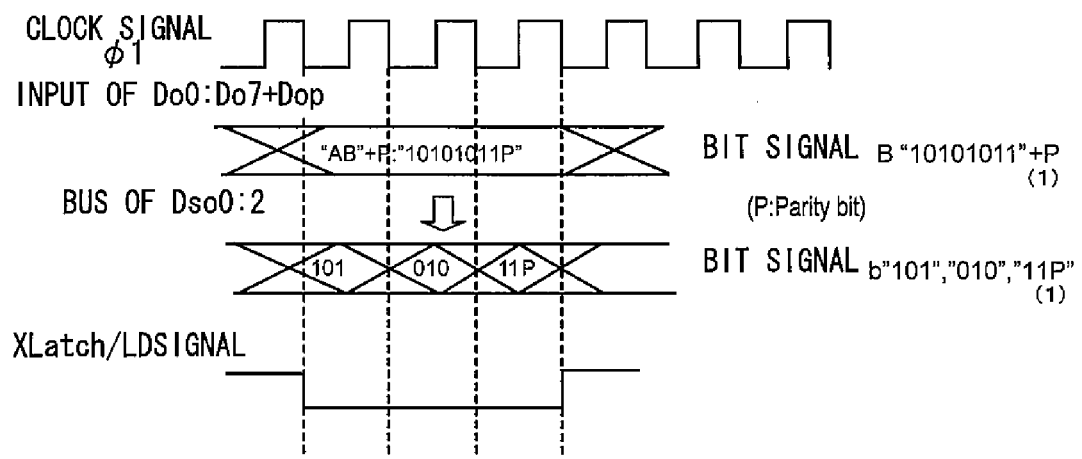
FIG. 7 is a timing chart illustrating an example of operation states of a bus width converter included in a signal output device according to an exemplary embodiment.

Here "P" is a parity signal, and for ease of explanation, a bit signal representing "1" is employed as the logical value thereof. FIG. 7 is a timing chart illustrating an example of operation states of the bus width converter 16 of the signal output device 12. As illustrated in Table 1 and FIG. 7, if the logical value of the XLatch/LDsignal is "1", then accompanying signal level fall of the clock signal $\phi 1$, the latch 42 passes the processing-target signal through to the parallel bus 52 as the bit signals Do0 to Do7, DoP. Accordingly, the bit signals Do0 to Do7, DoP are input to the first to third selectors 44, 46, 48 through the parallel bus 52. The bit signal Do0 with logical value "1" input to the first selector 44 though the signal line 52A is output to the signal line 24A as the bit signal Dso0. The bit signal Do1 with logical value "0" input to the second selector 46 through the signal line 52B is output to the signal line 24B as the second bit Dso1. The bit signal Do2 with logical value "1" input to the third selector 48 though the signal line 52C is output to the signal line 24C as the bit signal Dso2. Thus the bus width converter 16 outputs a 3 bit signal of logical value "101" to the parallel bus 24 as the bit signals Dso0 to Dso2.

Then, as illustrated in Table 1 and FIG. 7, in cases in which the logical value of the XLatch/LDsignal transitions from "1" to "0", the through bit signals Do0 to Do7, DoP are latched at the signal level fall of the clock signal $\phi 1$. The bit signal Do3 of logical value "0" input to the first selector 44 through the signal line 52D is output to the signal line 24A as the bit signal Dso0. The bit signal Do4 of logical value "1" input to the second selector 46 through the signal line 52E is output to the signal line 24B as the bit signal Dso1. The bit signal Dso5 of logical value "0" input to the third selector 48 through the signal line 52F is output to the signal line 24C as the bit signal Dso2. Thus the bus width converter 16 outputs a 3 bit signal of logical value "010" to the parallel bus 24 as the bit signals Dso0 to Dso2.

Then, as illustrated in Table 1 and FIG. 7, in cases in which the logical value of the XLatch/LDsignal is "0", the latch 42 keeps the latched bit signals Do0 to Do7, DoP at the signal level fall of the clock signal $\phi 1$. The bit signal Do6 of logical value "1" input to the first selector 44 through the signal line 52G is output to the signal line 24A as the bit signal Dso0. The bit signal Do7 of logical value "1" input to the second selector 46 through the signal line 52H is output to the signal line 24B as the bit signal Dso1. The bit signal DoP of logical value "1" input to the third selector 48 through the signal line 52I is output to the signal line 24C as the bit signal Dso2. Thus the bus width converter 16 outputs a 3 bit signal of logical value "111" to the parallel bus 24 as the bit signals Dso0 to Dso2.

Figure 8:
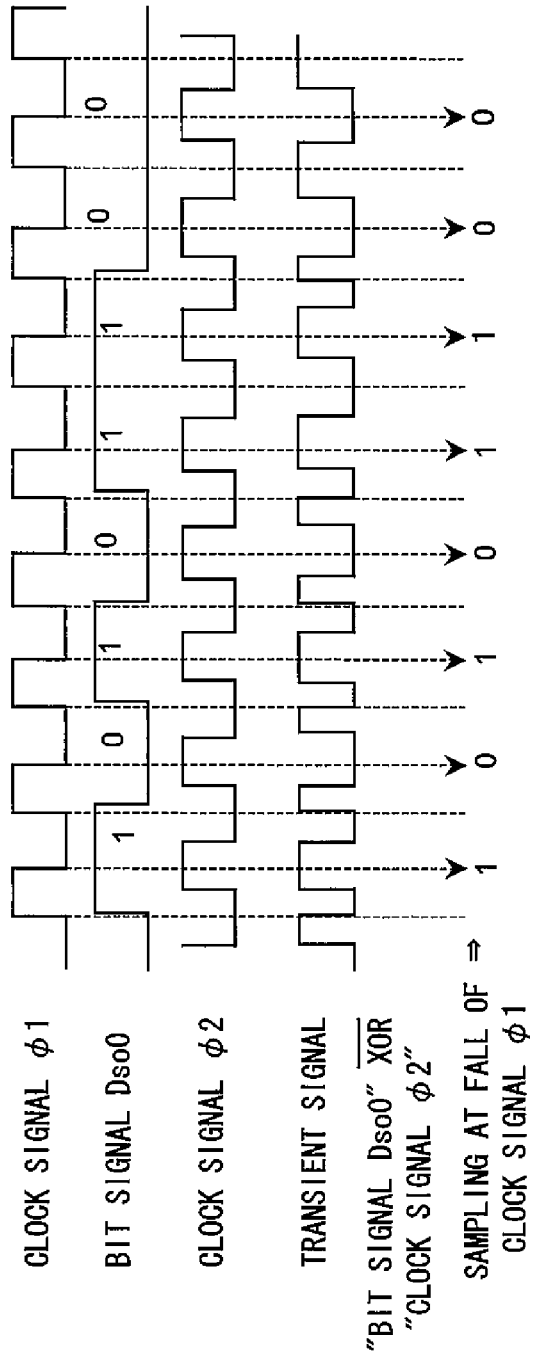
FIG. 8 is a timing chart illustrating an example of operation states of a transient signal generator included in a signal output device according to an exemplary embodiment.

FIG. 8 is a timing chart illustrating an example of an operation state of the transient signal generator 18 of the signal output device 12. The transient signal generator 18 samples the inverted logical value of the exclusive OR of the logical value of the bit signal Dso0 and the logical value of the clock signal $\phi 2$ at the fall of the clock signal $\phi 1$. The bit signal of the sampled logical value is then output as the transient signal Drz. For example, in cases in which the logical value of the bit signal Dso0 is "1" and the logical value of the clock signal $\phi 2$ is "1", then the logical value "1" is sampled at the fall of the clock signal $\phi 1$, and a bit signal of "1" is output as the transient signal Drz. In cases in which the logical value of the bit signal Dso0 is "0" and the logical value of the clock signal $\phi 2$ is "1", then the logical value "0" is sampled at the fall of the clock signal $\phi 1$, and a bit signal of logical value "0" is output as the transient signal Drz.

Figure 9:
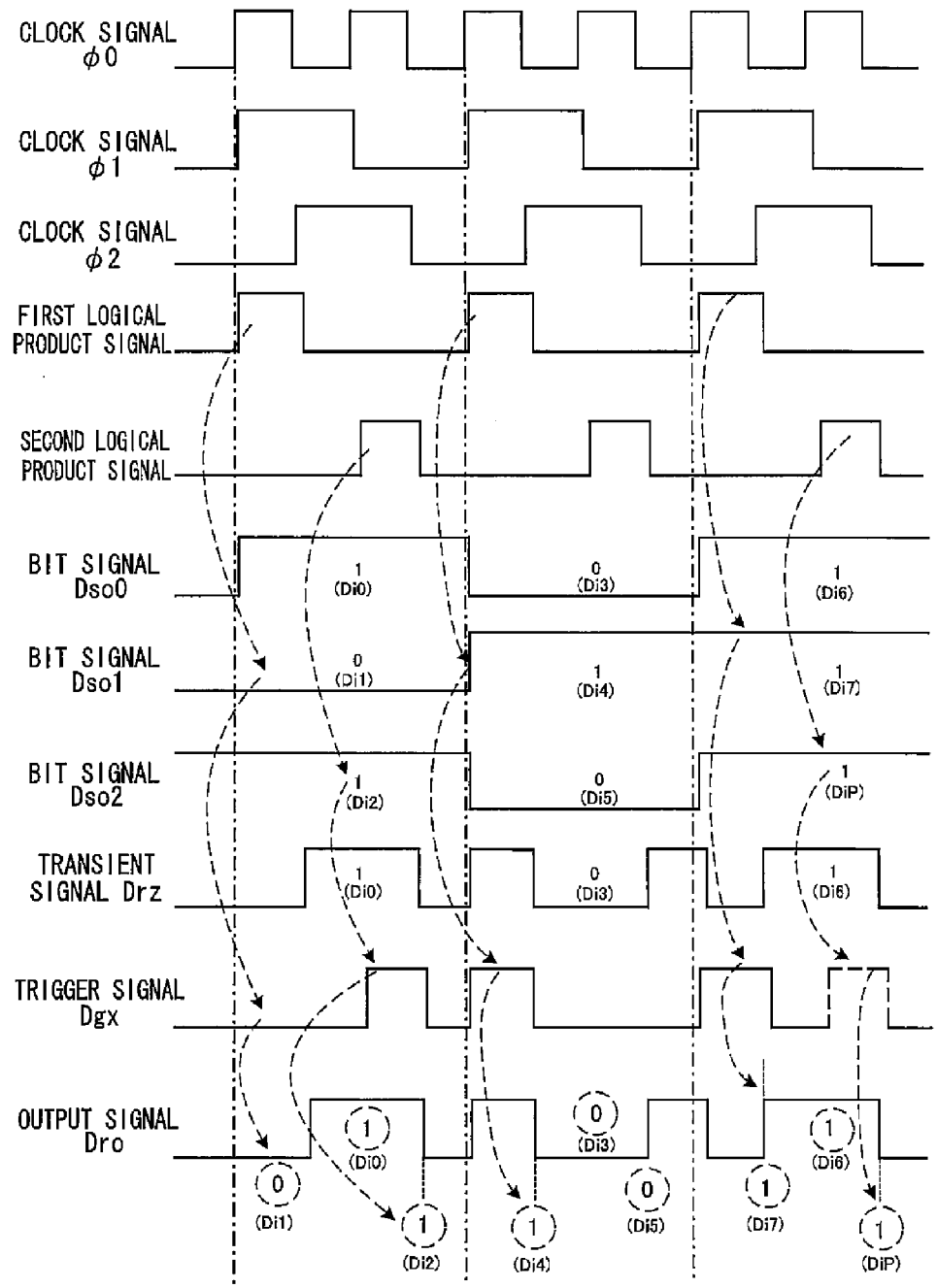
FIG. 9 is a timing chart illustrating an example of operation states of an output section and a control section included in a signal output device according to an exemplary embodiment.

FIG. 9 is a timing chart illustrating an example of operation states of the output section 20 and the control section 22. If the transient signal Drz is input through the signal line 25, the first output section 64 outputs the output signal Dro corresponding to the input transient signal Drz to the signal line 26.

The logical value of the bit signal Dso0 input to the signal line 24A illustrated in FIG. 2 is sampled via the transient signal Drz as the logical value of the output signal Dro, and output to the signal line 26 as the output signal Dro. Namely, the bit signal Dso0, corresponding to the bit signals Di0, Di3, Di6 as illustrated in FIG. 2, is output to the signal line 24A, and the transient signal Drz switches signal level according to the logical value of the bit signals Di0, Di3, Di6, as illustrated in the example in FIG. 9. The output signal Dro also switches signal level according to the logical value of the bit signals Di0, Di3, Di6.

Figure 10:
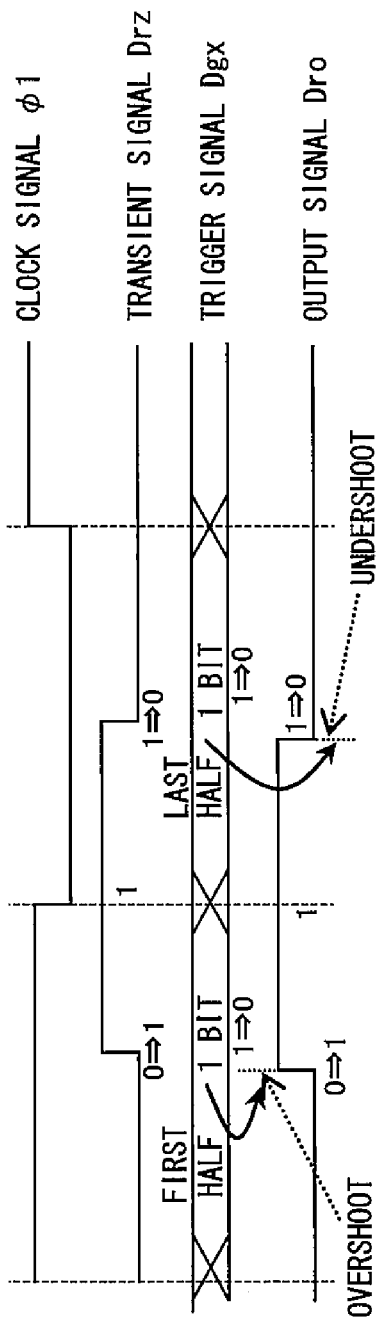
FIG. 10 is a timing chart to accompany explanation of a method causing overshoot and undershoot to occur in an output signal.

The logical value of the bit signal Dso1 input to the signal line 24B is sampled, via the transient signal Drz and the trigger signal Dgx, as the logical value of the output signal Dro. The logical value of the bit signal Dso2 input to the signal line 24C is also sampled via the transient signal Drz and the trigger signal Dgx as the logical value of the output signal Dro. For example, "1" is sampled according to overshoot occurrence caused at the rise of the output signal Dro or by undershoot occurrence caused at the fall of the output signal Dro. For example, in the present exemplary embodiment, if the logical value of the trigger signal Dgx transitions from "1" to "0" at a rise of the transient signal Drz, overshoot is generated at the corresponding rise of the output signal Dro as illustrated in FIG. 10. If the logical value of the trigger signal Dgx transitions from "1" to "0" at a fall in the transient signal Drz, undershoot is generated at the corresponding fall of the output signal Dro.

In the signal line 24B, as illustrated in FIG. 9, the bit signal Dso1 corresponding to the bit signals Di1, Di4, Di7 is output as illustrated in FIG. 2. In the example illustrated in FIG. 9, the logical value of the bit signal Dso1 corresponding to the bit signals Di4, Di7 is "1", and the logical value of the bit signal Dso1 corresponding to the bit signal Di1 is "0". Thus in cases in which the logical value of the bit signal Dso1 input to the signal line 24B is "1", if the trigger signal Dgx transitions from "1" to "0" at the fall of the transient signal Drz, undershoot is generated at the corresponding fall of the output signal Dro. The logical value "1" of the bit signal Dso1 corresponding to the bit signal Di4 is expressed as the output signal Dro by generating undershoot at the corresponding fall of the output signal Dro. In cases in which the logical value of the bit signal Dso1 corresponding to the bit signal Di7 is "1", if the trigger signal Dgx transitions from "1" to "0" at a rise in the transient signal Drz, overshoot is generated at the corresponding rise of the output signal Dro. The logical value "1" of the bit signal Dso1 corresponding to the bit signal Di7 is expressed as the output signal Dro by generating overshoot at the corresponding rise in the output signal Dro. In cases in which the logical value of the bit signal Dso1 corresponding to the bit signal Di1 is "0", the logical value of the trigger signal Dgx is held as "0". Due to holding the logical value "0" of the trigger signal Dgx, overshoot is not generated at the rise corresponding to the transient signal Drz, and undershoot is not generated at the fall corresponding to the transient signal Drz, in the output signal Dro. The logical value "0" of the bit signal Dso1 corresponding to the bit signal Di1 is expressed in the output signal by generating neither overshoot nor undershoot.

As illustrated in FIG. 2, the bit signal Dso2, corresponding to the bit signals Di2, Di5, DiP, is output to the signal line 24C as illustrated in FIG. 9. In the example illustrated in FIG. 9, the logical value of the bit signal Dso2 corresponding to the bit signals Di2, DiP is "1", and the logical value of the bit signal Dso2 corresponding to the signal Di5 is "0". Thus in cases in which the logical value of the bit signal Dso2 corresponding to the bit signals Di2, DiP is "1", if the trigger signal Dgx transitions from "1" to "0" at the fall in the transient signal Drz, undershoot is generated at the corresponding fall of the output signal Dro. The logical value "1" of the bit signal Dso2 corresponding to the bit signals Di2, DiP is expressed in the output signal Dro by generating undershoot at the corresponding fall of the output signal Dro.

In cases in which the logical value of the bit signal Dso2 corresponding to the bit signal Di5 input to the signal line 24C is "0", the logical value "0" of the trigger signal Dgx is held. Due to holding the logical value "0" of the trigger signal Dgx, overshoot is not generated at the rise corresponding to the transient signal Drz, and undershoot is not generated at the fall corresponding to the transient signal Drz, in the output signal Dro. The logical value "0" of the bit signal Dso2 corresponding to the bit signal Di5 is expressed in the output signal by generating neither overshoot nor undershoot.

Figure 11:
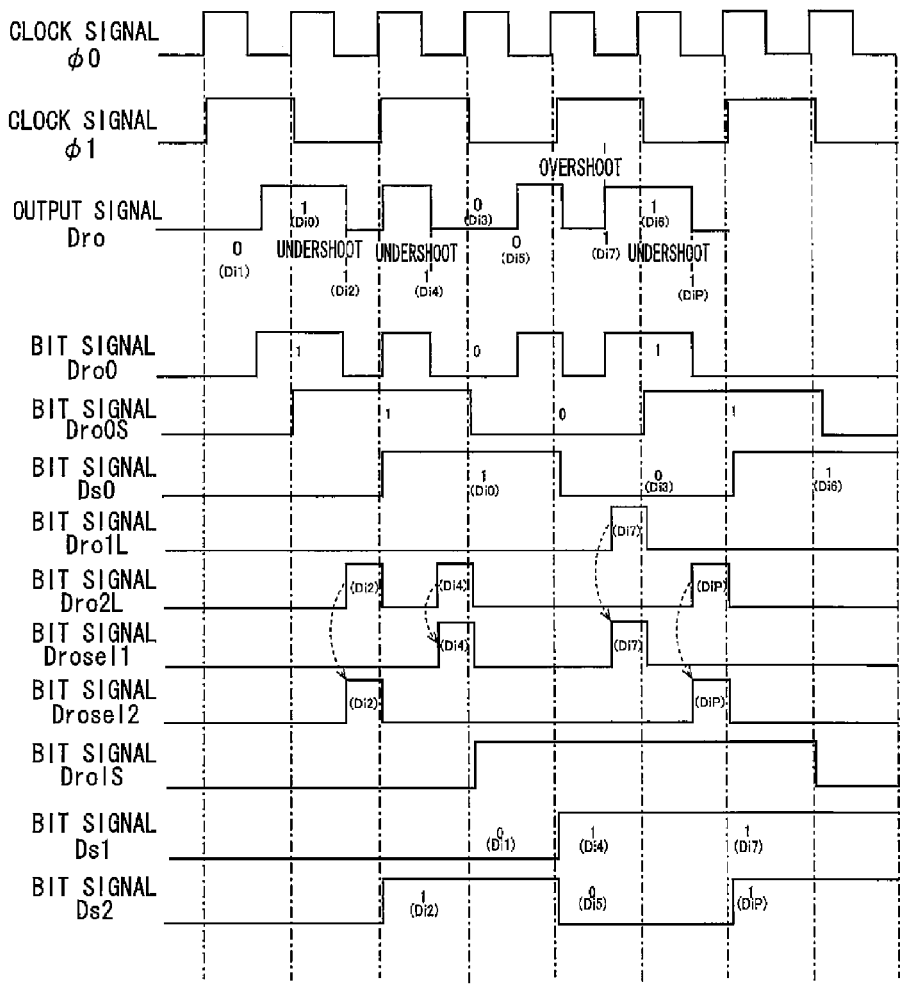
FIG. 11 is a timing chart illustrating an example of operation states of a comparator included in a signal input device according to an exemplary embodiment.

FIG. 11 is a timing chart illustrating an example of operation states of the comparator 30. The comparator 30 employs the protection circuit 116 to generate the bit signal Dro0 corresponding to the output signal Dro input from the output section 20 through the signal line 26. The bit signal Dro0 output from the protection circuit 116 is then converted into bit signal Dro0S by the FF circuit 118 and output to the FF circuit 120. The FF circuit 120 converts the bit signal Dro0S input from the FF circuit 118 to the bit signal Ds0, which is then output to the signal line 38A. The bit signal Ds0 is a bit signal corresponding to the bit signal Dso0 illustrated in FIG. 2. The bit signal Ds0 corresponds to the bit signals Di0, Di3, Di6. Thus the bit signal Ds0 expresses the logical value of the bit signal Dso0 corresponding to the bit signal Di0, the logical value of the bit signal Dso0 corresponding to the bit signal Di3, and the logical value of the bit signal Dso0 corresponding to the bit signal Di6.

The first comparator 34 determines whether or not there is overshoot at the rise of the output signal Dro input through the signal line 26. If overshoot has occurred at the rise of the input output signal Dro, the first comparator 34 transitions the logical value of the bit signal Dro1L from "0" to "1", and returns the logical value from "1" to "0" at the rise of the clock signal ϕ0. In contrast, the second comparator 36 determines whether or not there is undershoot at the fall in the output signal Dro input through the signal line 26. If undershoot has occurred at the fall of the input output signal Dro, the second comparator 36 transitions the logical value of the bit signal Dro2L from "0" to "1", and returns the logical value from "1" to "0" at the rise of the clock signal ϕ0.

The selector 132 samples the square waveforms corresponding to each of the bit signals Dso1, Dso2 from the input bit signals Dro1L, Dro2L. In the example illustrated in FIG. 11, a square waveform corresponding to the bit signal Di4 and a square waveform corresponding to the bit signal Di7 are included in the bit signal Dro1L as square waveforms corresponding to the bit signal Dso1. Thus the selector 132 samples the square waveform corresponding to the bit signal Di4 and the square waveform corresponding to the bit signal Di7 in the bit signal Dro1L, and outputs the samples as the bit signal Drosel 1.

However, the square waveform corresponding to the bit signal Di2 and the square waveform corresponding to the bit signal DiP are included as square waveforms corresponding to the bit signal Dso2 in the bit signal Dro2L. Thus the selector 132 samples the square waveform corresponding to the bit signal Di2 and the square waveform corresponding to the bit signal DiP in the bit signal Dro2L, and outputs the samples as the bit signal Drosel 2.

If the bit signal Drosel1 is input from the selector 132, the FF circuit 126 converts the input into the bit signal Dro1S, which is then output to the FF circuit 128. The FF circuit 128 converts the bit signal Dro1S input from the FF circuit 126 into a bit signal Ds1 that is delayed by ½ the cycle of the clock signal $\phi$1, and then outputs the bit signal Ds1 to the signal line 38B.

The FF circuit 130 converts the bit signal Drosel2 input from the selector 132 into a bit signal Ds2, and outputs the bit signal Ds2 to the signal line 38C. The bit signal Ds2 transitions the logical value of the bit signal Ds1 from "0" to "1" at the fall in the bit signal Drosel2, and returns the logical value from "1" to "0" after waiting 1 cycle of the clock signal $\phi$1.

Thus in the comparator 30, the logical value of the bit signal Dso0 (the logical values of each of the bit signals Di0, Di3, Di6) is output as the bit signal Ds1. The logical value of the bit signal Dso1 (the logical values of each of the bit signals Di1, Di4, Di7) is output as the bit signal Ds1. The logical value of the bit signal Dso2 (the logical values of each of the bit signals Di2, Di5, DiP) is output as the bit signal Ds2.

Figure 12:
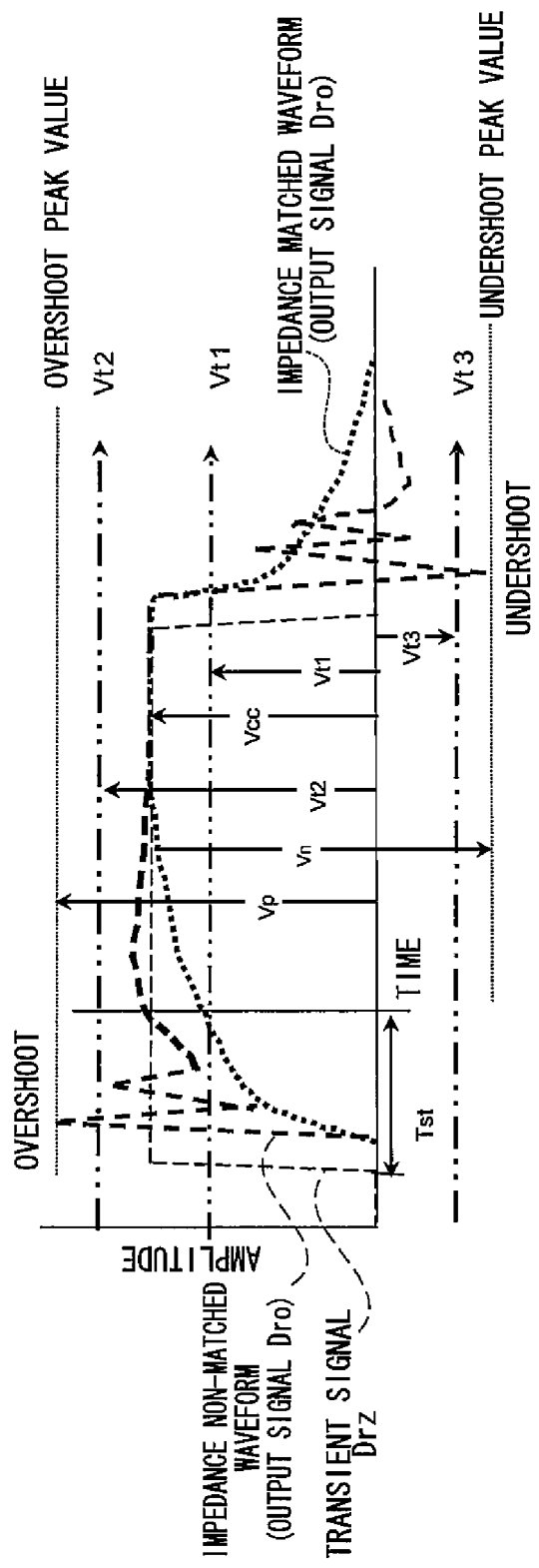
FIG. 12 is a signal waveform diagram to accompany explanation of a determination method of overshoot and undershoot of an output signal in a comparator included in a signal input device according to an exemplary embodiment.

FIG. 12 schematically illustrates mutual relationships between waveform expressing the transient signal Drz, the waveform expressing the output signal Dro during impedance matching/mismatching, the normal determination threshold value, the overshoot determination threshold value, and the undershoot determination threshold value. During the rising periods and the falling periods of the transient signal Drz, overshoot does not occur at the corresponding rise in the output signal Dro in cases in which the characteristic impedance of the signal line 26 and the output impedance of the output section 20 match. Undershoot also does not occur at the corresponding fall in the output signal Dro. Thus in the period from the end of rise to the start of fall in the output signal Dro, if the signal level (normal wave height value) Vcc exceeds a normal determination threshold value Vt1, then 3 bit data of "010" is expressed by the output signal Dro. As long as the signal level of the output signal Dro does not exceed the normal determination threshold value Vt1, 3 bit data of "000" is expressed by the output signal Dro.

In contrast thereto, in cases in which the characteristic impedance of the signal line 26 does not match the output impedance of the output section 20 during the rising period of the transient signal Drz, overshoot occurs at the rise of the output signal Dro. As an example of the rising period of the transient signal Drz, a period Tst is illustrated in FIG. 12 from the start of rising to the finish of rising. If generation of a mismatch between the characteristic impedance of the signal line 26 and the output impedance of the output section 20 is caused in the period Tst, then, for example as illustrated in FIG. 12, overshoot of Vp from the "0" of the transient signal Drz occurs in the wave height value.

Moreover, if the characteristic impedance of the signal line 26 does not match the output impedance of the output section 20 during the falling period of the transient signal Drz, then undershoot occurs in the fall of the output signal Dro. If generation of a mismatch between the characteristic impedance of the signal line 26 and the output impedance of the output section 20 is caused during the fall, then, as illustrated in FIG. 12, undershoot of Vn from a wave height value of "1" occurs in the transient signal Drz.

Thus 3 bit data of "111" is expressed by the output signal Dro if the rising wave height value exceeds an overshoot determination threshold value Vt2, if the normal wave height value exceeds the normal determination threshold value Vt1, and the falling wave height value exceeds an undershoot determination threshold value Vt3. Reference here to "the rising wave height value" indicates, for example, the wave height value of the output signal Dro during rising, reference here to the "normal wave height value" indicates the normal wave height value Vcc of the output signal Dro, and reference here to the "falling wave height value" indicates, for example, the wave height value of the output signal Dro during the falling period.

Moreover, 3 bit data of "110" may be expressed by the output signal Dro in cases in which overshoot occurs during the rising period of the transient signal Drz, and undershoot does not occur during the falling period thereof. Namely, 3 bit data of "110" is expressed by the output signal Dro if the rising wave height value exceeds the overshoot determination threshold value, and the normal wave height value Vcc of the output signal Dro exceeds the normal determination threshold value.

Moreover, "011" may be expressed by the output signal Dro in cases in which overshoot has not occurred in the rising period of the transient signal Drz, and undershoot has occurred in the falling period thereof. Namely, 3 bit data of "011" is expressed by the output signal Dro if the normal wave height value Vcc of the output signal Dro has exceeded the normal determination threshold value and the falling wave height value has exceeded the undershoot determination threshold value.

Figure 13:
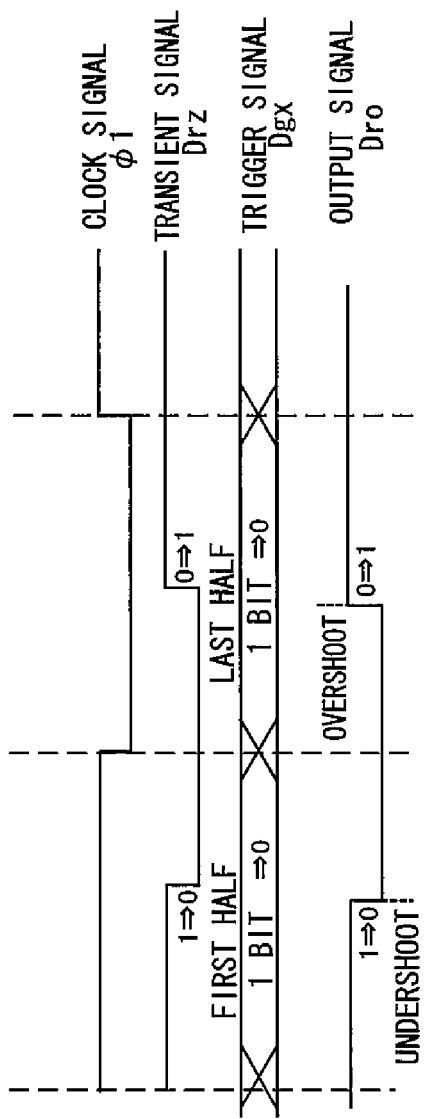
FIG. 13 is timing chart to accompany explanation of a creation method of an output signal expressing 3 bit data of "101", "100", and "010" in a comparator included in a signal input device according to an exemplary embodiment.

In cases in which 3 bit data of "101", "100", and "001" is expressed by the output signal Dro, the transient signal Drz, illustrated as an example in FIG. 13, may be employed. The transient signal Drz illustrated in FIG. 13 is an inverted signal of the transient signal Drz illustrated in FIG. 10. Thus the output signal Dro is also an inverted signal of the transient signal Dro illustrated in FIG. 10. An undershoot is generated at the fall of the output signal Dro illustrated in FIG. 13 due to the trigger signal transitioning from "1" to "0" in the period the transient signal Drz transitions from "1" to "0". An overshoot is generated at the rise of the output signal Dro illustrated in FIG. 13 due to the trigger signal transitioning from "1" to "0" in the period the transient signal Drz transitions from "0" to "1".

Thus 3 bit data of "101" is expressed due to the rising wave height value exceeding the overshoot determination threshold value, and the falling wave height value crossing the undershoot determination threshold value. 3 bit data of "100" is expressed by the rising wave height value exceeding the overshoot determination threshold value but no undershoot being generated in the fall of the output signal Dro. 3 bit data of "001" is expressed by no overshoot being generated in the rise of the output signal Dro, but the falling wave height value exceeding the undershoot determination threshold value.

Figure 14:
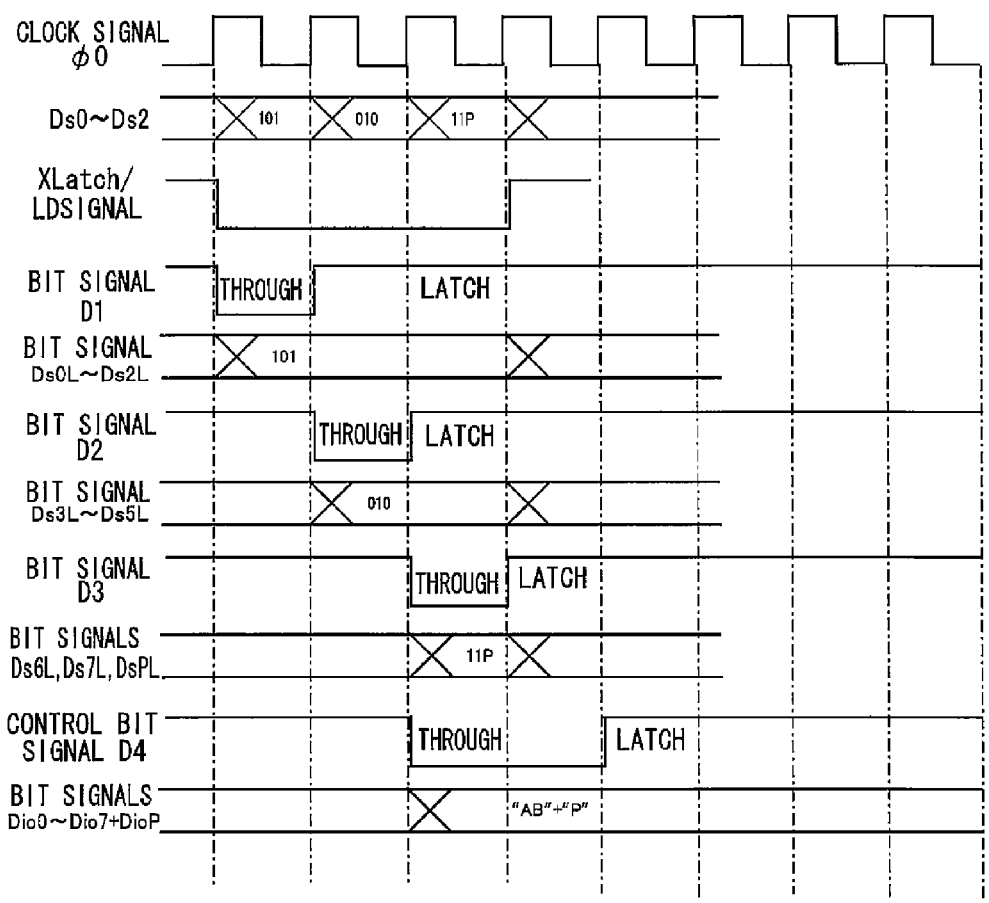
FIG. 14 is a timing chart illustrating an example of operation states of a bus width converter included in a signal input device according to an exemplary embodiment.

FIG. 14 is a timing chart illustrating an example of operation states of the bus width converter 32. In cases in which the logical value of the XLatch/LDsignal is "0", the bit signals Ds0, Ds1, Ds2 are incorporable in the fourth latch 142 through the first to third latches 136, 138, 140. In cases in which the logical value of the XLatch/LDsignal is "0", the logical values of the bit signals D1, D2, D3 transition from "1" to "0" in sequence for each cycle of the clock signal $\phi$0, and the logical value "0" is held for one cycle of the clock signal $\phi$0, and then transition is made to a logical value "1".

In cases in which the logical value of the bit signal D1 is "0", the first latch 136 passes the bit signals Ds0 to Ds2, input from the parallel bus 38, through to the fourth latch 142. Namely, the first latch 136 passes the bit signal Dso1 corresponding to the bit signal Di3 (in this example a bit signal expressing "1") through to the fourth latch 142. The first latch 136 passes the bit signal Ds1L corresponding to the bit signal Di1 (in this example a bit signal expressing logical value "0") through to the fourth latch 142. The first latch 136 passes the bit signal Ds2L corresponding to the bit signal Di2 (in this example a bit signal expressing logical value "1") through to the fourth latch 142.

In cases in which the logical value of the bit signal D2 is "0", the second latch 138 passes the bit signals Ds0 to Ds2, input from the parallel bus 38, through to the fourth latch 142. Namely, the second latch 138 passes the bit signal Ds3L corresponding to the bit signal Di3 (in this example a bit signal expressing logical value "0") through to the fourth latch 142. The second latch 138 passes the bit signal Ds4L corresponding to the bit signal Di4 (in this example a bit signal expressing "1") through to the fourth latch 142. The second latch 138 passes the bit signal Ds5L corresponding to the bit signal Di5 (in this example a bit signal expressing logical value "0") through to the fourth latch 142.

In cases in which the logical value of the bit signal D3 is "0", the third latch 140 passes the bit signals Ds0 to Ds2, input from the parallel bus 38, through to the fourth latch 142. Namely, the third latch 140 passes the bit signal Ds6L corresponding to the bit signal Di6 (in this example a bit signal expressing "1") through to the fourth latch 142. The third latch 140 passes the bit signal Ds7L corresponding to the bit signal Di7 (in this example a bit signal expressing logical value "1") through to the fourth latch 142. The third latch 140 passes the bit signal DsPL corresponding to the bit signal DiP (in this example a bit signal expressing logical value "1") through to the fourth latch 142.

If the logical value of the bit signal D3 transitions from "1" to "0", accompanying this transition, the logical value of the control bit signal transitions from "1" to "0", and then after holding "0" for 2 cycles of the clock signal $\phi 0$, transitions from "0" to "1". In cases in which the logical value of the control bit signal is "0", the fourth latch 142 passes the bit signals Ds0L, Ds1L, Ds2L, input from the first latch 136, as they are through as the bit signals Doi0, Doi1, Doi2. In cases in which the logical value of the control bit signal is "0", the fourth latch 142 passes the bit signals Ds3L, Ds4L, Ds5L, input from the second latch 138, as they are through as the bit signals Doi3, Doi4, Doi5. In cases in which the logical value of the control bit signal is "0", the fourth latch 142 passes the bit signals Ds6L, Ds7L, DsPL, input from the third latch 140, as they are through as the bit signals Doi6, Doi7, DoiP.

Thus in the communication system 10, occurrence of overshoot such that the rise of the output signal Dro exceeds the overshoot determination threshold value is caused selectively, and also occurrence of undershoot such that the fall exceeds the undershoot determination threshold value is caused selectively. Thus due to the output signal Dro being output from the signal output device 12 to the signal line 26 in a maximum of 3 bit units for each cycle of the clock signal, the signal transmission volume per unit time can be increased in comparison to cases lacking the present configuration. There is no need to increase the frequency of the clock signal due to increasing the signal transmission volume, and a conventional emphasis circuit, pre-emphasis circuit, and equalizing circuit are rendered unnecessary.

In conventional technology, if unintentional overshoot and undershoot, occur at the rise and fall of the transient signal Drz, processing is performed to suppress the overshoot and undershoot. In contrast thereto, in the communication system 10 according to the present exemplary embodiment, the overshoot determination threshold value and the undershoot determination threshold value are values such that overshoot and undershoot does not occur due to external noise. The occurrence overshoot and undershoot are caused selectively by to exceeding the overshoot determination threshold value and the undershoot determination threshold value. Accordingly, even suppose external noise that conventionally causes an overshoot in the rise of the signal waveform, or external noise that conventionally causes an undershoot in the fall of the signal waveform, were to be incorporated in the output signal Dro, then logical values to be transmitted are not liable to change. This thereby enables the logical values to be transmitted from the signal output device 12 to the signal input device 14 to be transmitted with high precision.

Moreover, being able to incorporate a bit signal (for example a parity signal), allocated to a specific signal line included in a conventional parallel bus, to the output signal Dro, enables the real-time communication performance to be secured without change from convention, even without employing the specific signal line. Moreover, it is also possible to eliminate the influence of crosstalk that tends to occur in a serial bus.

Note that although a case has been described above of a function to cause a mismatch to occur between the output impedance of the output section 20 and the characteristic impedance of the signal line 26 by outputting a superimposition signal for the second output section 66, the technology disclosed herein is not limited thereto. Examples include providing a variable resistor capable of switching between the resistance value of the first resistor 70 and the resistance value of the second resistor 88 in place of the first resistor 70, together with providing a switch to switch between the resistance value of the first resistor 70 and the resistance value of the second resistor 88, in place of the second output section 66. In such cases, similar effects to those described above may be achieved by switching operation according to the trigger signal Dgx such that the resistance value of the variable resistor is the resistance value of the second resistor 88 during the period when the superimposition signal described above is output, and is the resistance value of the first resistor 70 at other times.

Technology disclosed herein exhibits the advantageous effect of enabling the signal transmission volume per unit time to be increased.

All publications, patent applications and technical standards mentioned in the present specification are incorporated by reference in the present specification to the same extent as if the individual publication, patent application, or technical standard was specifically and individually indicated to be incorporated by reference.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A signal output device, comprising:
an output section that is input with a base waveform signal provided with a signal level transition period within each cycle, wherein a signal level of the base waveform signal in a signal level non-transition period before or after the signal level transition period is differentiated according to a value of a first bit of output-target data, and that outputs an output signal corresponding to the input base waveform signal to an output transmission path; and a control section that, in the signal level non-transition period, matches an output impedance of the output section to a characteristic impedance of the output transmission path, and also matches the output impedance of the output section to the characteristic impedance of the output transmission path in the signal level transition period in a case in which a second bit of the output-target data is a first value, and generates a mismatch between the output impedance of the output section and the characteristic impedance of the output transmission path in the signal level transition period in a case in which the second bit of the output-target data is a second value, so as to cause generation of a change in waveform in the output signal in the signal level transition period such that the absolute value of the signal level of the output signal exceeds a preset threshold value.

2. The output data of claim 1, wherein
the output section includes:
a first output section that is input with the base waveform signal, and that outputs the output signal corresponding to the input base waveform signal to the output transmission path at an output impedance matched to the characteristic impedance of the output transmission path; and
a second output section that is input with the base waveform signal, and that is capable of outputting, to the output transmission path, a signal equivalent to the output signal corresponding to the input base waveform signal at an output impedance smaller than the output impedance of the first output section, and wherein,
the control section adopts a non-output state in which a signal equivalent to the output signal is not output from the second output section during the signal level non-transition period, also adopts the non-output state during the signal level transition period in a case in which a second bit of the output-target data is a first value, and adopts an output state in which a signal equivalent to the output signal is output from the second output section in the signal level transition period in a case in which the second bit of the output-target data is a second value, so as to cause generation of a waveform change in the output signal in the signal level transition period such that the absolute value of the signal of the output signal exceeds the threshold value.

3. The signal output device of claim 2, wherein
the first output section includes a first resistor connected to the output transmission path, and outputs the output signal at an output impedance matched to the characteristic impedance by outputting the output signal to the output transmission path through the first resistor, and
the second output section includes a second resistor with a smaller resistance value than the first resistor and connected to the output transmission path, and outputs a signal equivalent to the output signal to the output transmission path at an output impedance smaller than the output impedance of the first output section by outputting the signal equivalent to the output signal to the output transmission path through the second resistor.

4. The signal output device of claim 1, wherein
the signal level transition period is a signal level rising period or a signal level falling period, and
the control section:
matches the output impedance of the output section to the characteristic impedance of the output transmission path in the signal level non-transition period;
matches the output impedance of the output section to the characteristic impedance of the output transmission path in one period out of the rising period or the falling period in a case in which a second bit of the output-target data is a first value;
causes, in the one period, a generation of waveform change in the output signal of the one period such that the absolute value of the signal level of the output signal exceeds the threshold value by causing generation of a mismatch between the output impedance of the output section and the characteristic impedance of the output transmission path in a case in which the second bit of the output-target data is a second value;
matches the output impedance of the output section to the characteristic impedance of the output transmission path in the other period out of the rising period or the falling period in a case in which a third bit of the output-target data is a first value; and
causes, in the other period, generation of a waveform change in the output signal of the other period such that the absolute value of the signal level of the output signal exceeds the threshold value by causing generation of a mismatch between the output impedance of the output section and the characteristic impedance of the output transmission path in a case in which the third bit of the output-target data is a second value.

5. The signal output device of claim 4, wherein
the output section includes:
a first output section that is input with the base waveform signal and outputs the output signal corresponding to the input base waveform signal to the output transmission path at an output impedance matching the characteristic impedance of the output transmission path; and
a second output section that is input with the base waveform signal, and that is capable of outputting, to the output transmission path, a signal equivalent to the output signal corresponding to the input base waveform signal at an output impedance smaller than the output impedance of the first output section, and
the control section adopts a non-output state in which a signal equivalent to the output signal is not output from the second output section during the signal level non-transition period,
also adopts the non-output state in the one period in a case in which the second bit is the first value,
also adopts the non-output state in the other period in a case in which the third bit is the first value, and
adopts an output state in which a signal equivalent to the output signal is output from the second output section in the one period in a case in which the second bit is the second value, so as to cause generation of a waveform change in the output signal of the one period such that the absolute value of the signal level of the output signal exceeds the threshold value, and
the control section adopts an output state in which a signal equivalent to the output signal is output from the second output section in the other period in a case in which the third bit is the second value, so as to cause generation of a waveform change in the output signal of the other period such that the absolute value of the signal level of the output signal exceeds the threshold value.

6. The signal output device of claim 5, wherein
the first output section includes a first resistor connected to the output transmission path, and outputs the output signal at an output impedance matched to the characteristic impedance by outputting the output signal to the output transmission path through the first resistor, and
the second output section includes a second resistor with a smaller resistance value than the first resistor and connected to the output transmission path, and outputs a signal equivalent to the output signal to the output transmission path at an output impedance smaller than the output impedance of the first output section by outputting the signal equivalent to the output signal to the output transmission path through the second resistor.

7. A communication system, comprising:
the signal output device of claim 1; and
a comparator that, in the signal level transition period, compares the signal level of the output signal output from the signal output device to at least one of an overshoot determination threshold value for determining whether or not an overshoot has been generated in a rise of signal level of the output signal or an undershoot determination threshold value for determining whether or not an undershoot has been generated in a fall of signal level of the output signal.

8. The communication system of claim 7, wherein
the comparator includes:
a first comparison section that compares the signal level of the output signal output from the signal output device in the signal level transition period to the overshoot determination threshold value; and
a second comparison section that compares the signal level of the output signal output from the signal output device in the signal level transition period to the undershoot determination threshold value.

9. A signal output method, comprising:
inputting a base waveform signal provided with a signal level transition period within each cycle, wherein a signal level of the base waveform signal in a signal level non-transition period before or after the signal level transition period is differentiated according to a value of a first bit of output-target data, and outputting an output signal corresponding to the input base waveform signal from an output section to an output transmission path; and
in the signal level non-transition period, matching an output impedance of the output section to a characteristic impedance of the output transmission path, and also matching the output impedance of the output section to the characteristic impedance of the output transmission path in the signal level transition period in a case in which a second bit of the output-target data is a first value, and causing generation of a mismatch between the output impedance of the output section and the characteristic impedance of the output transmission path in the signal level transition period in a case in which the second bit of the output-target data is a second value, so as to cause generation of a change in waveform in the output signal in the signal level transition period such that the absolute value of the signal level of the output signal exceeds a preset threshold value.

10. The signal output method of claim 9, wherein
in the output section, which includes a first output section, and a second output section that is input with the base waveform signal and that is capable of outputting, to the output transmission path, a signal equivalent to the output signal corresponding to the input base waveform signal at an output impedance smaller than the output impedance of the first output section, the output signal corresponding to the base waveform signal input to the first output section is output from the first output section to the output transmission path at an output impedance matched to the characteristic impedance of the output transmission path, and generation of a waveform change is caused in the output signal in the signal level transition period such that the absolute value of the signal of the output signal exceeds the threshold value by, in the signal level non-transition period, adopting a non-output state in which a signal equivalent to the output signal from the second output section is not output, also adopting the non-output state in a case in which a second bit of the output-target data is a first value, and adopting an output state in which a signal equivalent to the output signal is output from the second output section during the signal level transition period in a case in which the second bit of the output-target data is a second value.

11. The signal output method of claim 10, wherein
the output signal is output at an output impedance matched to the characteristic impedance by outputting the output signal from the first output section, which includes a first resistor connected to the output transmission path, to the output transmission path through the first resistor, and
a signal equivalent to the output signal is output to the output transmission path at an output impedance smaller than the output impedance of the first output section by outputting the signal equivalent to the output signal from the second output section, which includes a second resistor with a smaller resistance value than the first resistor and that is connected to the output transmission path, to the output transmission path through the second resistor.

12. The signal output method of claim 9, wherein
the signal level transition period is a signal level rising period or a signal level falling period, and
the output impedance of the output section is matched to the characteristic impedance of the output transmission path in the signal level non-transition period;
the output impedance of the output section is matched to the characteristic impedance of the output transmission path in one period out of the rising period or the falling period in a case in which a second bit of the output-target data is a first value; i
n the one period, generation of a waveform change is caused in the output signal of the one period such that the absolute value of the signal level of the output signal exceeds the threshold value by causing generation of a mismatch between the output impedance of the output section and the characteristic impedance of the output transmission path in a case in which the second bit of the output-target data is a second value;
the output impedance of the output section is matched to the characteristic impedance of the output transmission path in the other period out of the rising period or the falling period in a case in which a third bit of the output-target data is a first value; and
in the other period, generation of a waveform change is caused in the output signal of the other period such that the absolute value of the signal level of the output signal exceeds the threshold value by causing generation of a mismatch between the output impedance of the output section and the characteristic impedance of the output transmission path in a case in which the third bit of the output-target data is a second value.

13. The signal output method of claim 12, wherein
in the output section, which includes a first output section, and a second output section that is input with the base waveform signal and that is capable of outputting, to the output transmission path, a signal equivalent to the output signal corresponding to the input base waveform signal at an output impedance smaller than the output impedance of the first output section, the output signal corresponding to the base waveform signal input to the first output section is output from the first output section to the output transmission path at an output impedance matched to the characteristic impedance of the output transmission path, and a non-output state in which a signal equivalent to the output signal is not output from the second output section is adopted in the signal level non-transition period, the non-output state is also adopted in the one period in a case in which the second bit is the first value, the non-output state is also adopted in the other period in a case in which the third bit is the first value, and an output state in which a signal equivalent to the output signal is output from the second output section is adopted in the one period in a case in which the second bit is the second value, so as to cause generation of a waveform change in the output signal of the one period such that the absolute value of the signal level of the output signal exceeds the threshold value, and an output state in which a signal equivalent to the output signal is output from the second output section is adopted in the other period in a case in which the third bit is the second value, so as to cause generation of a waveform change in the output signal of the other period such that the absolute value of the signal level of the output signal exceeds the threshold value.

14. The signal output method of claim 13, wherein the output signal is output at an output impedance matched to the characteristic impedance by outputting the output signal from the first output section, which includes a first resistor connected to the output transmission path, to the output transmission path through the first resistor, and a signal equivalent to the output signal is output to the output transmission path at an output impedance smaller than the output impedance of the first output section by outputting the signal equivalent to the output signal from the second output section, which includes a second resistor with a smaller resistance value than the first resistor and that is connected to the output transmission path, to the output transmission path through the second resistor.

15. A communication method, comprising:

outputting the output signal by employing the signal output method of claim 9; and in the signal level transition period, comparing the signal level of the output signal to at least one of an overshoot determination threshold value for determining whether or not an overshoot has been generated in a rise of signal level of the output signal, or an undershoot determination threshold value for determining whether or not an undershoot has been generated in a fall of signal level of the output signal.

16. The communication method of claim 15, wherein in the signal level transition period, the signal level of the output signal is compared to the overshoot determination threshold value; and in the signal level transition period, the signal level of the output signal is compared to the undershoot determination threshold value.

\* \* \* \* \*